(12) United States Patent
Levy et al.

(10) Patent No.: US 9,806,174 B2
(45) Date of Patent: Oct. 31, 2017

(54) DOUBLE-RESURF LDMOS WITH DRIFT AND PSURF IMPLANTS SELF-ALIGNED TO A STACKED GATE "BUMP" STRUCTURE

(71) Applicant: Tower Semiconductor Ltd., Migdal Haemek (IL)

(72) Inventors: Sagy Levy, Zichron-Yaakov (IL); Sharon Levin, Haifa (IL); Noel Berkovitch, Rishon LeZion (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 15/254,836

(22) Filed: Sep. 1, 2016

(65) Prior Publication Data

US 2016/0372578 A1 Dec. 22, 2016

Related U.S. Application Data

(60) Division of application No. 14/080,758, filed on Nov. 14, 2013, now Pat. No. 9,484,454, which is a
(Continued)

(51) Int. Cl.
*H01L 29/66* (2006.01)
*H01L 29/06* (2006.01)
(Continued)

(52) U.S. Cl.
CPC .. *H01L 29/66681* (2013.01); *H01L 21/02233* (2013.01); *H01L 21/02255* (2013.01);
(Continued)

(58) Field of Classification Search
CPC ............... H01L 29/66537; H01L 29/66681
See application file for complete search history.

(56) References Cited

U.S. PATENT DOCUMENTS 5,045,491 A 9/1991 Gill et al.
5,366,916 A * 11/1994 Summe ............ H01L 21/82385
257/369
(Continued)

OTHER PUBLICATIONS

Bengtsson et al. "Small-Signal and Power Evaluation of Novel BiCMOS-Compatible Short-Channel LDMOS Technology", IEEE Transactions on Microwave Theory and Techniques, vol. 51, No. 3, Mar. 2003, pp. 1052-1056.
(Continued)

*Primary Examiner* — Daniel Whalen
*Assistant Examiner* — Suberr Chi
(74) *Attorney, Agent, or Firm* — Bever, Hoffman & Harms, LLP

(57) ABSTRACT

A double-RESURF LDMOS transistor has a gate dielectric structure including a shallow field "bump" oxide region and an optional raised dielectric structure that provides a raised support for the LDMOS transistor's polysilicon gate electrode. Fabrication of the shallow field oxide region is performed through a hard "bump" mask and controlled such that the bump oxide extends a minimal depth into the LDMOS transistor's drift (channel) region. The hard "bump" mask is also utilized to produce an N-type drift (N-drift) implant region and a P-type surface effect (P-surf) implant region, whereby these implants are "self-aligned" to the gate dielectric structure. The N-drift implant is maintained at Vdd by connection to the LDMOS transistor's drain diffusion. An additional Boron implant is utilized to form a P-type buried layer that connects the P-surf implant to the P-body region of the LDMOS transistor, whereby the P-surf implant is maintained at 0V.

20 Claims, 15 Drawing Sheets

Related U.S. Application Data continuation-in-part of application No. 12/260,806, filed on Oct. 29, 2008, now Pat. No. 9,330,979.

(51) Int. Cl.

| | |
|---|---|
| *H01L 29/10* | (2006.01) |
| *H01L 21/265* | (2006.01) |
| *H01L 21/266* | (2006.01) |
| *H01L 21/762* | (2006.01) |
| *H01L 21/8234* | (2006.01) |
| *H01L 21/8238* | (2006.01) |
| *H01L 27/092* | (2006.01) |
| *H01L 29/423* | (2006.01) |
| *H01L 29/78* | (2006.01) |
| *H01L 21/32* | (2006.01) |
| *H01L 21/02* | (2006.01) |
| *H01L 21/225* | (2006.01) |
| *H01L 21/3105* | (2006.01) |
| *H01L 27/06* | (2006.01) |
| *H01L 21/324* | (2006.01) |
| *H01L 29/08* | (2006.01) |
| *H01L 29/40* | (2006.01) |

(52) U.S. Cl.
CPC ........ *H01L 21/2253* (2013.01); *H01L 21/266* (2013.01); *H01L 21/26513* (2013.01); *H01L 21/26586* (2013.01); *H01L 21/31053* (2013.01); *H01L 21/32* (2013.01); *H01L 21/76224* (2013.01); *H01L 21/823418* (2013.01); *H01L 21/823462* (2013.01); *H01L 21/823814* (2013.01); *H01L 21/823857* (2013.01); *H01L 27/0617* (2013.01); *H01L 27/0922* (2013.01); *H01L 29/0634* (2013.01); *H01L 29/0653* (2013.01); *H01L 29/0878* (2013.01); *H01L 29/1095* (2013.01); *H01L 29/42368* (2013.01); *H01L 29/66689* (2013.01); *H01L 29/7816* (2013.01); *H01L 21/324* (2013.01); *H01L 29/086* (2013.01); *H01L 29/402* (2013.01)

(56) References Cited

U.S. PATENT DOCUMENTS

| | | |
|---|---|---|
| 6,100,556 A | 8/2000 | Drowley et al. |
| 6,211,552 B1 | 4/2001 | Efland et al. |
| 6,468,870 B1 | 10/2002 | Kao et al. |
| 6,483,149 B1 | 11/2002 | Mosher et al. |
| 6,693,339 B1 | 2/2004 | Khemka et al. |
| 6,800,528 B2 | 10/2004 | Sasaki |
| 6,818,494 B1 | 11/2004 | Chen et al. |
| 6,882,023 B2 | 4/2005 | Khemka et al. |
| 6,900,101 B2 | 5/2005 | Lin |
| 7,575,977 B2 | 8/2009 | Levin et al. |
| 2004/0041265 A1 | 3/2004 | Gonzalez et al. |
| 2005/0112822 A1 | 5/2005 | Litwin |
| 2005/0148114 A1 | 7/2005 | Rhodes |
| 2006/0006489 A1 | 1/2006 | Park |
| 2006/0124999 A1 | 6/2006 | Pendharkar |
| 2008/0073746 A1 | 3/2008 | Tanaka |
| 2010/0102386 A1 | 4/2010 | You |
| 2010/0102388 A1 | 4/2010 | Levin et al. |

OTHER PUBLICATIONS

Itonaga et al. "A High-Performance and Low-Noise CMOS Image Sensor with an Expanding Photodiode under the Isolation Oxide", Electron Devices Meeting, 2005, IEDM Technical Digest, IEEE International, Dec. 5-7, 2005, 4 pgs.

Parthasarathy et al. "A Double Resurf LDMOS With Drain Profile Engineering for Improved ESD Robustness", IEEE Electron Device Letters, vol. 23, No. 4, Apr. 2002, pp. 212-214.

\* cited by examiner

DOUBLE-RESURF LDMOS WITH DRIFT AND PSURF IMPLANTS SELF-ALIGNED TO A STACKED GATE "BUMP" STRUCTURE

RELATED APPLICATION

The present application is a divisional of commonly owned U.S. patent application Ser. No. 14/080,758, filed Nov. 14, 2013 and entitled DOUBLE-RESURF LDMOS WITH DRIFT AND PSURF IMPLANTS SELF-ALIGNED TO A STACKED GATE "BUMP" STRUCTURE, which is a continuation-in-part of commonly owned U.S. Pat. No. 9,330,979 issued May 3, 2016 and entitled "LDMOS Transistor Having Elevated Field Oxide Bumps and Method of Making Same".

BACKGROUND OF THE INVENTION

Field of the Invention

The present invention relates to a double-RESURF-type lateral diffused MOSFET (LDMOS) transistor having a stacked oxide/dielectric "bump" gate support structure and associated self-aligned N-drift and P-surf implants, and to a method for fabricating such double-RESURF LDMOS transistors.

Related Art

RESURF (Reduced Surface Field) technology is one of the most widely used methods in Power management applications for providing high voltage (HV) transistors exhibiting both a high break down voltage (BV) and a low specific resistance ($R_{DSON}$). The RESURF technique is a set up in an LDMOS transistor that includes a vertical PN junction in which its depletion layer extends upward and reaches the surface before breakdown occurs in the horizontal direction. As a result the surface electric field is reduced significantly. The resulting shape of the lateral electric field in this case (RESURF) would be a trapezoidal shape, contrary to the standard, conventional LDMOS case where the electric field has a triangular shape. The trapezoidal shape of the electric field translates itself to an advantage of higher voltage for the same doping density which translates to the same $R_{DSON}$ for a higher BV. This is the reason that the RESURF technique gives the very best trade-off between $R_{DSON}$ and BV. One good side effect of the RESURF technique is that it involves forming laterally diffused metal oxide semiconductor (LDMOS) transistors in a relatively thin layer of epitaxial (Epi) layer, which is less time consuming to produce, and the resulting "RESURF LDMOS" transistors having a much higher BV and lower $R_{DSON}$ than conventional vertical power transistors. The thinner Epi thickness is due to the need to reach with the depletion layer all the way to the upper Epi surface, which requires a relatively thin Epi.

FIG. 6 is a cross sectional view of a conventional RESURF LDMOS transistor 10, which includes P+ substrate 11, P− epitaxial layer 12, deep p-well region 13, P+ backgate contact 14, N+ source region 15, N type reduced surface field region 16, N+ drain contact region 17, gate oxide layer 18, field oxide regions 19-1 and 19-2 and gate electrode POLY-1. Field oxide regions 19-1 and 19-2 are formed simultaneously by conventional local oxidation of silicon (LOCOS) or poly-buffered LOCOS (PBL). Field oxide region 19-2 provides electrical isolation between LDMOS transistor 10 and other devices (not shown) fabricated in the same substrate. Field oxide region 19-2 must be relatively thick to provide such isolation. For example, field oxide region 19-2 typically has a thickness of about 5000 Angstroms or more (depending on the technology node). Because field oxide regions 19-1 and 19-2 are thermally grown, half of these oxide regions are grown underneath the silicon surface. Thus, field oxide regions 19-1 and 19-2 extend into the silicon surface to a depth of about 2500 Angstroms or more. Because they are fabricated at the same time, field oxide regions 19-1 and 19-2 have the same thickness. Field oxide region 19-1 is thick enough to protect gate oxide layer 18 from high electric fields that result from voltages applied to drain contact region 17. That is, the field oxide region 19-1 is sufficiently thick under polysilicon gate electrode POLY-1 where the diffusion region 16 extends between the channel edge and the drain contact region 17. LDMOS transistor 10 is described in more detail in U.S. Pat. No. 6,483,149 to Mosher et al.

In high voltage and power applications, it is desirable to minimize the on-resistance $R_{DSON}$ of LDMOS transistor 10, such that the switch area and power dissipation associated with this transistor 10 is minimized. However, current flowing through LDMOS transistor 10 is forced to bypass the field oxide region 19-1, thereby resulting in a relatively high $R_{DSON}$. That is, the current flowing through LDMOS transistor 10 must flow deep within the silicon, along the relatively long path that exists under field oxide region 19-1.

FIG. 7 is a cross sectional view of another conventional LDMOS transistor 20, wherein field oxide regions 19-1 and 19-2 are replaced by shallow trench isolation (STI) regions 29-1 and 29-2, and polysilicon gate electrode POLY-1 is replaced by polysilicon gate electrode POLY-2. STI regions 29-1 and 29-2 are formed simultaneously by conventional methods (i.e., etching trenches in the substrate, and then filling the trenches with dielectric material). STI region 29-2 provides electrical isolation between LDMOS transistor 20 and other devices (not shown) fabricated in the same substrate. In general, STI region 29-2 extends deeper below the surface of the substrate in comparison to field oxide region 19-2, as trench isolation is almost completely below the silicon surface. Thus, in the described example, STI region 29-2 usually has a depth of about 3500 Angstroms. Because they are fabricated at the same time, STI regions 29-1 and 29-2 have the same depth (e.g., 3500 Angstroms). The large depth of STI region 29-1 causes LDMOS transistor 20 to exhibit higher on-resistance than LDMOS transistor 10. In addition, the sharp corners typical of STI region 29-1 (compared to the smooth profile at the LOCOS bird's beak region) locally increases the electric field at those corners, which results in rapid hot carrier degradation and lower breakdown voltage within LDMOS transistor 20.

Another issue associated with the use of RESURF LDMOS transistors in high current applications involving inductive loads is that unwanted current injection to the substrate is generated by way of a parasitic bipolar transistor formed by the body/deep-N-well/substrate regions of the RESURF LDMOS transistor. To avoid the excess minority injection causing this parasitic bipolar, a common practice is to use a technique in which an N+ buried layer (NBL) is formed under the entire deep-N-well region in which the LDMOS transistor is formed (i.e., in the region where the the epitaxial layer meets the base underlying substrate). Although such N+ Buried layer architecture LDMOS transistors are superior to earlier LDMOS transistors in high current applications, the NBL acts to reduce the BV, and also results in higher $R_{DSON}$ for a given breakdown voltage.

FIG. 8 is a cross sectional view of a conventional double-RESURF NBL architecture LDMOS transistor 30 that illustrates a recent methodology that takes advantage of the NBL isolation while maintaining high BV by providing a P+ buried layer (P-Well) in the epitaxial layer between the NBL and the deep N-well located below the LOCOS gate oxide and containing the drain portion of the LDMOS. The double RESURF architecture is an extension to the RESURF case (described above) in which an electrical field shape is tailored to hold optimal maximal BV. This technique including depleting the drift layer from two directions, contrary to regular RESURF which does not necessary involves depletion from two sides. FIG. 8 shows an example of depleting from two sides that involves depleting from the bottom using the buried P-well, and depleting from the top by causing the gate to "climb" over the oxide that forms the extended drain. The resulting electrical field would be closer to the ideal rectangular shape than in the case of single RESURF (which involves depletion from one side only). In the double-RESURF case the area under the electric field distance curve will be larger and hence would carry a larger BV for a given $R_{DSON}$. The P-Well serves to gain back the desired high BV for devices having smaller geometries by inducing depletion in the drift region of the epitaxial layer, and is formed by implanting ions of an P-type material (e.g., Boron (B) in the semiconductor substrate of the device) over a portion of the NBL, and then up-diffusing the P-type ions into an epitaxial layer to provide the desired position of the P-well between the NBL and a N-well containing the drain portion of the LDMOS.

A problem with the conventional double-RESURF approach illustrated in FIG. 8 is that it requires the use of a complicated boron implant process that utilizes extra high energy from the top of the device to be buried below the deep N-well, as disclosed in "A Double-RESURF LDMOS With Drain Profile Engineering for Improved ESD Robustness" by V Parthasarathy Et Al, in IEEE ELECTRON DEVICE LETTERS, VOL. 23, NO. 4, APRIL 2002 p212. The Boron, which forms the PBL, is implanted with the Antimony (Sb) that forms the NBL, and diffuses faster than the Sb, and so desirably forms the PBL between the deep N-well and the NBL. However, the process requires the formation of two separate masks having specific thicknesses in order to effectively implant the Boron and Sb at the proper dosages and depths such that they form the required PBL and NBL regions.

Another problem associated with the conventional double-RESURF approach is that it is very difficult to scale the implant process for higher voltages. That is, in the prior art case to scale the voltage deeper more energetic implant is needed and is also limited.

Yet another problem associated with the conventional double-RESURF approach is that patterning the P-well below the N-well (extended drain implant) is either restricted to the layout of the extended drain or requires an extra mask. That is, it is important to be able to pattern the PBL (independently from the NBL) in order to optimize the BV vs. $R_{DSON}$ characteristics of the cell.

What is needed is an improved double-RESURF LDMOS transistor addressing the problems set forth above. What is also needed is a cost effective and reliable method for generating such improved double-RESURF LDMOS transistors, wherein the method requires minimal modifications to a standard process flow.

SUMMARY

According to an embodiment of the present invention, a double reduced surface field (double-RESURF) LDMOS transistor includes a gate dielectric structure that does not extend substantially beneath the upper surface of the epitaxial silicon layer on which the double-RESURF LDMOS is fabricated. The gate dielectric structure is fabricated using a hard "bump" mask, and includes performing a thermal oxidation process that forms a shallow field oxide ("bump oxide") on the substrate surface exposed inside an opening defined in the "bump" mask opening, and then optionally forming a raised dielectric structure that is entirely disposed over (i.e., "stacked" on top of) the bump oxide. The bump oxide is characterized in that it only extends below the upper substrate surface to a depth that is much shallower than (e.g., $\frac{1}{6}^{th}$ or less as deep as) the depth of field isolation regions used to isolate the double-RESURF LDMOS transistor from other various structures fabricated on the substrate, and much shallower than (e.g., $\frac{1}{5}^{th}$ as deep as) typical LOCOS gate dielectrics used in conventional double-RESURF LDMOS transistors. A benefit of the bump oxide is that the current path through the resulting double-RESURF LDMOS transistor is substantially unimpeded under the bump oxide. After the bump oxide has been formed, the optional layer of gate dielectric material is deposited over the resulting structure such that the gate dielectric material fills the opening of the hard "bump" mask. A chemical mechanical polishing (CMP) process is then performed to remove the gate dielectric material located over the hard mask, thereby forming the raised dielectric structure on top of the bump oxide (within the opening of the "bump" mask). The "bump" mask is then removed and the remainder of the LDMOS transistor is fabricated as set forth below. The thickness of the raised dielectric structure is effectively selected by controlling the height of the hard "bump" mask. The bump oxide and the overlying raised dielectric structure collectively form a stacked gate dielectric structure upon which the polysilicon gate structure of the double-RESURF LDMOS transistor is formed, and exists almost entirely above the upper surface of the semiconductor substrate (i.e., above the epitaxial silicon layer). The resulting double-RESURF LDMOS transistor exhibits a low on-resistance in comparison to LDMOS transistor formed using conventional methods, along with breakdown and threshold voltages comparable or better than conventional LDMOS transistors. In an alternative embodiment, the gate dielectric structure is entirely formed by oxidation of the silicon areas exposed by the bump mask opening.

According to another aspect of the present invention, an N-type drift (N-drift) implant region and a P-type surface effect (P-surf) implant region are disposed below the drift (channel) region of the LDMOS transistor dielectric and maintained at predetermined voltage levels in order to generate an optimal double-RESURF effect. In the exemplary embodiment, the N-drift implant region is maintained at a system voltage (Vdd) by way of connection to the N+ drain implant of the LDMOS transistor, and the P-surf implant region is maintained substantially at 0V by way of connection to a P-body region of the LDMOS transistor, whereby the N-drift and P-Surf implants that form a horizontal PN junction below the drift region of the LDMOS transistor. The implant processes used to generate the N-drift and P-surf implants are controlled such that the shape of the electrical field generated by these implants is as close as possible to a square shape, which facilitates an ideal double-RESURF performance (i.e., by achieving the highest possible BV to $R_{DSON}$ ratio). During operation a depletion layer extends upward from the PN junction formed by the N-drift and P-Surf implants toward the portion of the polysilicon gate structure disposed over the gate dielectric structure, which in turn creates a depletion layer extending downward. When the charge in the N-drift implant is balanced exactly by the charge in the P-surf implant plus the charge in the drift region induced by the polysilicon extending over the gate dielectric structure, an ideal double-RESURF effect is achieved.

According to another aspect of the present invention, the hard "bump" mask utilized to form the gate dielectric structure is further utilized to produce an N-type drift (N-drift) implant region and a P-type surface effect (P-surf) implant region that are located below and "self-aligned" to the gate dielectric structure. Specifically, the N-drift and P-surf implants are formed through the "bump" mask opening, e.g., prior to formation of the bump oxide, with the P-surf implant being formed using a high energy (e.g., Boron) implant process, and the N-drift implant being formed using a low energy (e.g., Phosphorous or Arsenic) implant process, whereby the the P-surf implant is formed below the N-drift implant, and whereby the P-surf and N-drift implants are self-aligned to the gate dielectric structure. The resulting double-RESURF LDMOS transistor combines the low-$R_{DSON}$ characteristics provided by the gate dielectric structure, with the benefits of providing P-surf and N-drift implants that are self-aligned to the gate dielectric structure, whereby the P-surf and N-drift implants further improve performance of the double-RESURF LDMOS transistor by 20% to 40% (i.e., the BV-to-$R_{DSON}$ ratio is improved by 20% to 40%). Moreover, by forming the P-surf and N-drift implants using the "bump" mask, the present invention both provides this enhanced performance characteristics in a highly efficient manner (i.e., by utilizing a single mask to provide a stacked gate dielectric structure, the P-surf implant and the N-drift implant). That is, the novel architecture and manufacturing method of the present invention can potentially provide enhanced double-RESURF performance by way of the best (highest possible) BV/$R_{DSON}$ ratio for a given LDMOS cell size.

According to an embodiment of the present invention, an additional Boron implant is utilized to form an additional P-type buried layer below the P-surf and P-body regions of the LDMOS transistor. In one embodiment, the additional Boron implant is deposited prior to deposition of the epitaxial silicon (i.e., at approximately the same time the N-type dopant is implanted that forms the N-type buried layer (NBL)), and annealing is performed after deposition of the epitaxial silicon such that the Boron up-diffuses into the epitaxial layer at a faster rate than the NBL dopant, whereby the resulting P-type buried layer (PBL) resides above the NBL and extends under the P-surf and P-body regions. This additional Boron implant further enhances performance of the double-RESURF LDMOS by providing good electrical connection between the LDMOS P-body region and the P-surf implant that causes the P-surf implant to maintain the desired 0V potential, which maximizes the double-RESURF effect because the depletion of the silicon below the stacked gate dielectric structure during the "off" operating state is enhanced (i.e., a higher N-drift dose can be used without lowering the BV but while lowering the $R_{DSON}$). In addition, the additional Boron implant further optimizes the RESURF effect by charge balancing of the P-surf and extended drain area without compromising the $R_{DSON}$ (i.e., because the Boron implant is buried at a depth that cannot be realized by ion implantation).

According to another embodiment of the present invention, the double-RESURF LDMOS is fabricated using a specific thermal budget associated with formation of the gate dielectric "bump" oxide and self-aligned P-surf and N-drift implants to enhance the double-RESURF effect by generating the lowest $R_{DSON}$ for a given BV (i.e., by maximizing the BV/$R_{DSON}$ ratio for a given BV). In one embodiment the thermal budget is implemented using a furnace-based drive that is performed after formation of the N-drift and P-surf implants and the gate dielectric "bump" oxidation (e.g., the furnace drive is performed as part of the "bump" oxide growth). The furnace drive is controlled to facilitate diffusion of n-type dopant material into the birds beak oxide regions located at the edges of the gate dielectric "bump" structure, and to facilitate diffusion of p-type dopant material under the N-drift region. The birds beak oxide regions can maintain a high resistance if it is not properly doped with n-type dopant during formation of the N-drift implant, and this higher resistance would increase $R_{DSON}$ and decrease device performance. The birds beak oxide regions extend under the bump mask, and as a result the birds beak oxide regions are not doped during the N-drift implant. The thermal budget compensates this deficiency by helping the n-type dopant to diffuse laterally from the initial N-drift implant into the birds beak oxide regions, thereby restoring low resistance characteristic of optimal device performance. The thermal budget also diffuses the P-surf implant laterally below the birds beak oxide regions, which also helps to maintain double-RESURF action below the birds beak oxide regions. The lateral diffusion of the P-surf dopant also creates a better coupling between the transistor body terminal and the P-surf implant, which further enhances the double-RESURF effect. Of course, careful optimization should be exercised between P-surf implant and N-drift implant process parameters (i.e., dosage amounts, implant energies and the thermal treatment temperatures/times). Ideally, these process parameters produce distinct P-surf and N-drift implant layers without counter doping, which would merge the P-surf and N-drift layers and would result in elimination of the double-RESURF effect.

According to additional alternative embodiments of the present invention, the separately patterned PBL and NBL implants are performed through a single mask, the N-type drain implant material is implanted at a 45° angle, and the N-type drain implant material is implanted through the nitride layer forming the "bump" mask. The single mask method for forming the separately patterned PBL and NBL implants involves utilizing a special mask having a first portion including one or more large openings and a second portion including an array of small openings, then using 45° and 90° directional implants, where the p-type dopant is directed at 45° such that it enter the substrate through the large opening but is prevented from entering the small openings, and the n-type dopant is directed at 90° such that it enter both the large and small openings. The N-type drain implant material is implanted at a 45° angle such that it reaches the birds beak regions of the bump oxide, thereby reducing $R_{DSON}$. Alternatively, the N-type drain implant material is implanted through the nitride layer of the "bump" mask (i.e., after a selective etch is used to remove the resist portion of the "bump" mask).

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to an improved LDMOS structure and fabrication method. The following description is presented to enable one of ordinary skill in the art to make and use the invention as provided in the context of a particular application and its requirements. As used herein, directional terms such as "above", "below", "upper", "lower", "vertical", and "horizontal" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
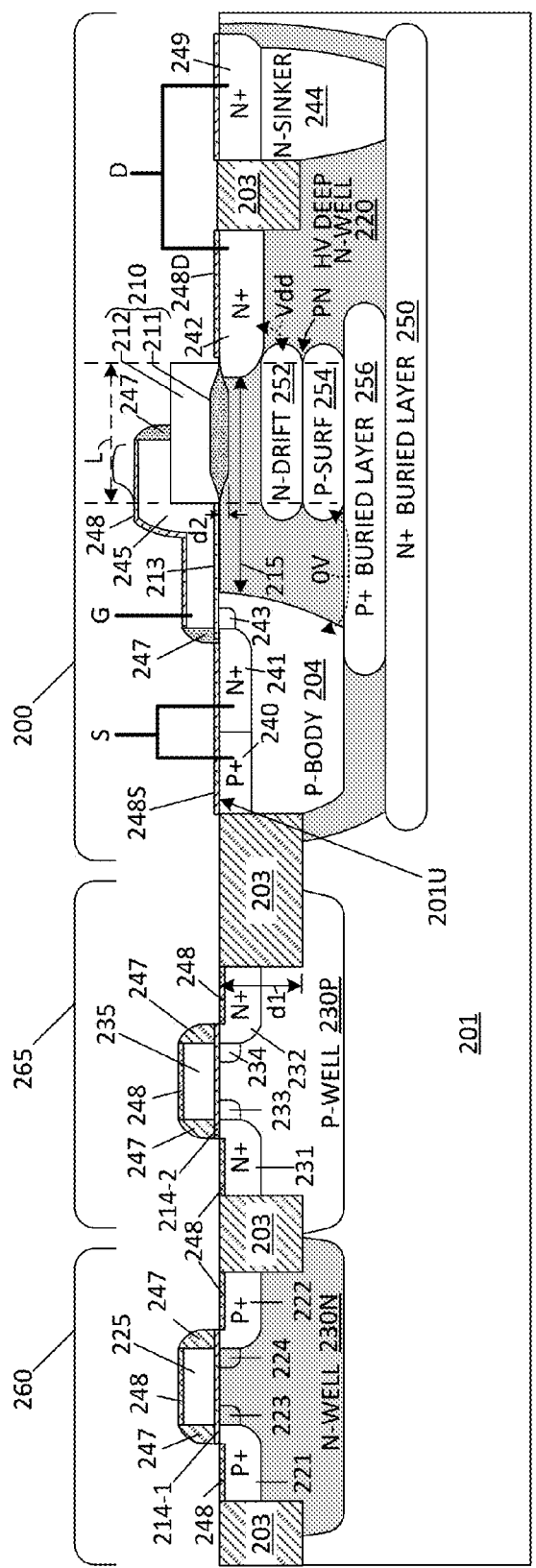
FIG. 1 is a cross-sectional view showing a double-RESURF LDMOS transistor in accordance with one embodiment of the present invention.

FIG. 1 is a cross-sectional view of a double-RESURF LDMOS transistor 200 formed on a semiconductor substrate 201 in accordance with one embodiment of the present invention. FIG. 1 also includes cross-sectional views of low voltage MOS transistors 260 and 265, which are fabricated on the same substrate as LDMOS transistor 200. As described in more detail below, the structure of FIG. 1 can be fabricated using a process that is compatible with a conventional deep sub-micron VLSI (CMOS) process. Transistors 200, 260 and 265 (and other circuit elements fabricated on the same substrate) are isolated by field isolation regions 203. In the illustrated embodiments, field isolation regions 203 are shallow trench isolation (STI) regions that extend below upper surface 201U of substrate 201 to a depth d1 of about 3500 Angstroms. In alternate embodiments, field isolation regions may be fabricated by LOCOS or PBL techniques such that these field isolation regions have a birds beak profile and a depth of about 2500 Angstroms.

Double-RESURF LDMOS transistor 200 includes several diffusion (implanted dopant) regions formed by majority concentrations of dopants having associated conductivity types (i.e., n-type and p-type) that are diffused inside substrate 201, and several additional structures that are formed on an upper surface 201U of substrate 201. The implants are formed in a high voltage (HV) deep n-type well region 220, which is formed over an N+ buried layer (NBL) 250, and include a p-type body (P− body) region 204, a P+ body contact region 240, an N+ source contact region 241, an N+ drain contact region 242, an N− source extension region 243, an N-type sinker region 244, and an N+ sinker contact region 249. Formed on and over upper surface 201U of substrate 201 are a gate dielectric layer 213, a polycrystalline silicon gate electrode 245, dielectric sidewall spacers 247, and metal salicide regions 248S and 248D. P-body region 204 is formed by a p-type dopant disposed in a source (first) portion of the HV deep N-well region 220, and is located below P+ body contact region 240 and N+ source contact region 241 and extends under a portion of gate electrode 245. N+ drain contact region 242 is formed by an n-type dopant disposed in a drain portion of HV deep N-well region 220, and is located below metal salicide region 248D. Additional implant regions and structures shown in FIG. 1 are introduced below. Specific passivation and metal via contacts to metal salicide regions 248 omitted from FIG. 1 for clarity and brevity, but source (S), drain (D) and gate (G) contacts are indicated by solid lines.

According to an aspect of the present invention, a portion of gate electrode 245 is formed on a gate dielectric (bump) structure 210 that includes a shallow field oxide region (bump oxide) 211 and an optional raised dielectric structure 212 (which, when used, is processed using CMP as mentioned below). As indicated in FIG. 1, base oxide layer portion 213 is located on upper substrate surface 201U over a source (first) portion of a HV deep N-well region 220, and gate dielectric structure 210 is located next to base oxide layer portion 213 over a channel (second) portion of HV deep N-well region 220. Gate electrode 245 includes a first portion disposed over base oxide layer 213 and a second portion disposed over part of gate dielectric structure 210.

Referring to the lower portion of gate dielectric structure 210, bump oxide 211 is formed by a thermally grown oxide structure that is characterized by having a "birds beak" profile extending only a shallow depth d2 below upper surface 201U. The shallow depth d2 is significantly less than the depth d1 of field isolation regions 203. Stated another way, the shallow depth d2 is significantly less than (e.g., 10% to 30% of) the depths of STI isolation regions 203, and significantly less than the depth of LOCOS oxides utilized to form gate dielectric structures of conventional LDMOS transistors. In one embodiment, the depth d2 is less than or equal to about 250 Angstroms. The relatively shallow depth d2 of bump oxide 211 provides for a relatively direct current path between the source region 241 and the drain region 242 through HV deep N-well region 220. That is, bump oxide 211 does not require current to be routed deep within HV deep N-well region 220 in order to flow through to drain region 242. As a result, the on-resistance $R_{DSON}$ of LDMOS transistor 200 is significantly lower than the on-resistance of a conventional LDMOS transistor. In the described embodiment, the on-resistance of LDMOS transistor 200 is reduced by approximately 30% compared with a conventional LDMOS transistor with STI regions, while the robustness to hot carrier degradation and "on"-state breakdown due to snapback are significantly improved as well.

Optional raised dielectric structure 212 is disposed directly on top of bump oxide 211, and has a height (thickness) that is precisely adjusted using CMP to extend the breakdown voltage BV of LDMOS transistor 200, and is disposed between the right-most portions of gate electrode 245 and the underlying drift region within HV deep N-well region 220 (and drain region 242). As described in more detail below, the thickness and/or material of raised dielectric structure 212 can be precisely controlled to provide the required isolation for LDMOS transistor 200. Because the gate isolation may be increased by increasing the vertical height of raised dielectric structure 212, and not by generating thermal oxide (whose area is determined by the required oxide depth), it is possible to increase the gate isolation without increasing the layout area of LDMOS transistor 200. Consequently, the layout area of LDMOS transistor 200 may advantageously be minimized. In addition, the LDMOS transistor 200 of the described embodiment advantageously exhibits a similar or higher breakdown voltage (BVdss) and a similar threshold voltage ($V_{TH}$) as a conventional LDMOS transistor.

According to another aspect of the present invention, double-RESURF LDMOS transistor 200 includes an n-type drift (N-drift) implant 252 and a p-type surface field (P-surf) implant 254 that are disposed in a vertical stack and located below drift region 215 of LDMOS transistor 200 (i.e., below raised gate dielectric structure 210). N-drift implant 252 and P-surf implant 254 respectively extend horizontally under gate dielectric structure 210 (i.e., extending in the direction indicated by arrow 215, and also extending into the plane of FIG. 1). During operation, N-drift implant 252 is maintained at a system voltage (Vdd) by way of connection to N+ drain implant 242, and the P-surf implant 254 is maintained substantially at 0V by way of connection to P-body region 204 in the manner described below, whereby N-drift implant 252 and P-Surf implant 254 form a horizontal PN junction (indicated by "PN" in FIG. 1) below drift region 215. With this arrangement, an electric field is generated by a depletion layer extending upward from the PN junction formed between N-drift implant 252 and P-Surf implant 254 toward the portion of polysilicon gate structure 245 disposed over gate dielectric structure 210, and a depletion layer extending downward from gate structure 245. When the charge in N-drift implant 252 is balanced exactly by the charge in P-surf implant 254 plus the charge in drift region 215 induced by the portion of gate structure 245 extending over gate dielectric structure 210, an ideal double-RESURF effect is achieved. In one embodiment, the implant processes used to generate N-drift implant 252 and P-surf implant 254 are controlled such that the shape of this electrical field is as close as possible to a square shape to facilitate optimal double-RESURF performance (i.e., by achieving the highest possible BV to $R_{DSON}$ ratio). That is, the square electrical field shape generated by N-drift implant 252 and P-surf implant 254 is optimal for maintaining a maximum BV at a lowest $R_{DSON}$, thereby producing an optimal BV to $R_{DSON}$ ratio.

According to yet another aspect of the present invention, N-drift implant 252 and P-surf implant 254 are "self-aligned" to gate dielectric structure 210. Specifically, N-drift implant 252, P-surf implant 254 and gate dielectric structure 210 are all formed through the same opening in a "bump" mask (described below), whereby N-drift implant 252 is formed by a diffused n-type dopant that is in HV deep N-well region 220 directly below gate dielectric structure 210, and P-surf implant 254 is formed by a diffused p-type dopant and is disposed in HV deep N-well region 220 directly below N-drift implant 252. As set forth below, in one embodiment P-surf implant 254 is formed through the "bump" mask opening using a high energy Boron implant process, N-drift implant 252 is formed through the same "bump" mask opening using a low energy Phosphorous or Arsenic implant process, and then gate dielectric structure 210 is formed in the "bump" mask opening using the methods described below, whereby P-surf implant 254 is formed below N-drift implant 252 (i.e., between P-surf implant 254 is formed between N-drift implant 252 and NBL 250), and both are formed directly below gate dielectric structure 210. As such, N-drift implant 252 and P-surf implant 254 are "self-aligned" to gate dielectric structure 210 in that, because they are implanted through the same "bump" mask opening, opposing edges of the gate dielectric structure 210 are substantially vertically aligned with corresponding outer boundary edges of N-drift implant 252 and P-surf 254, as indicated by the vertical dashed lines extending downward from the upper surface 201U. As used herein, the term "self-aligned" is defined as meaning that the corresponding outer boundary edges of each structure/implant are substantially vertically aligned (i.e., accounting for lateral drift that occurs during diffusion) in a manner that can only be achieved by way of processing through a common (single) mask opening. The benefit of "self-aligned" N-drift implant 252 and P-surf implant 254 to gate dielectric structure 210 is that the electrical parameters (e.g., $R_{DSON}$ and BV) of LDMOS transistor 200 are less sensitive to process variations. More specifically, the relative positions of N-drift implant 252, P-surf implant 254 and gate dielectric structure 210 significantly affects current flow in the drift region of LDMOS transistor 200, and forming these features using two or more masks would produce slight misalignment (due to photolithographic variations) that would cause undesirable fluctuations in the electrical parameters (e.g., BV and $R_{DSON}$), particularly when LDMOS transistors 200 are produced using large scale manufacturing. Such undesirable electrical parameter fluctuations are avoided by using a single (common) mask (i.e., "bump" mask 205/206) to form all of N-drift implant 252, P-surf implant 254 and gate dielectric structure 210.

Double-RESURF LDMOS transistor 200 thus combines the low-$R_{DSON}$ characteristics provided by bump oxide 211 with the benefits of providing self-aligned P-surf implant 254 and N-drift implant 252, whereby the resulting structure exhibits enhanced performance characteristics that are substantially better than conventional double-RESURF LDMOS transistors.

According to an embodiment of the present invention, an optional additional "deep" P+ (e.g., Boron) implant 256, referred to herein as "P+ buried layer" or "PBL" 256, is formed between NBL 250 and P-surf region 254. PBL 256 is formed, for example, during the deposition of epitaxial silicon (i.e., as described in additional detail below), and extends under under P-body region 204 and P-surf implant 254. PBL 256 further enhances performance of double-RESURF LDMOS 200 by providing good electrical connection between P-body region 204 and P-surf implant 254, which causes P-surf implant 254 to maintain the desired zero volt (0V) potential, and which maximizes the double-RESURF effect by creating a large depletion layer. By maintaining P-surf implant 254 at a potential as close as possible to 0V, the voltage difference between P-surf implant 254 and N-drift implant 252 is maximized, which in turn maximizes the depletion layer generated during operation. That is, the large depletion layer generated by this arrangement cannot be achieved if P-surf implant 254 is disconnected from P-body 204 (i.e., if P-surf implant 254 is floating), which might also generate undesirable currents through parasitic devices/routes. By maximizing the depletion layer width, N-drift implant 252 can be larger and still fully depleted, which is a condition for achieving the RESURF or double-RESURF effects. That is, a larger N-drift implant 252 reduces resistance in drift region 215 while maintaining the same BV, which produces a BV/$R_{DSON}$ ratio that is superior to that achieved by conventional approaches. In addition, deep P+ implant 256 further optimizes the RESURF effect by charge balancing of P-surf and extended drain area without compromising the $R_{DSON}$ (i.e., because deep-P+ implant 256 is buried at a depth that cannot be realized by ion implantation).

The fabrication of LDMOS transistor 200 in accordance with one embodiment of the present invention will now be described. Low voltage CMOS transistors 260 and 265 (shown in FIG. 1 only) are fabricated concurrently with LDMOS transistor 200 in a manner consistent with VLSI (CMOS) techniques.

Figure 2:
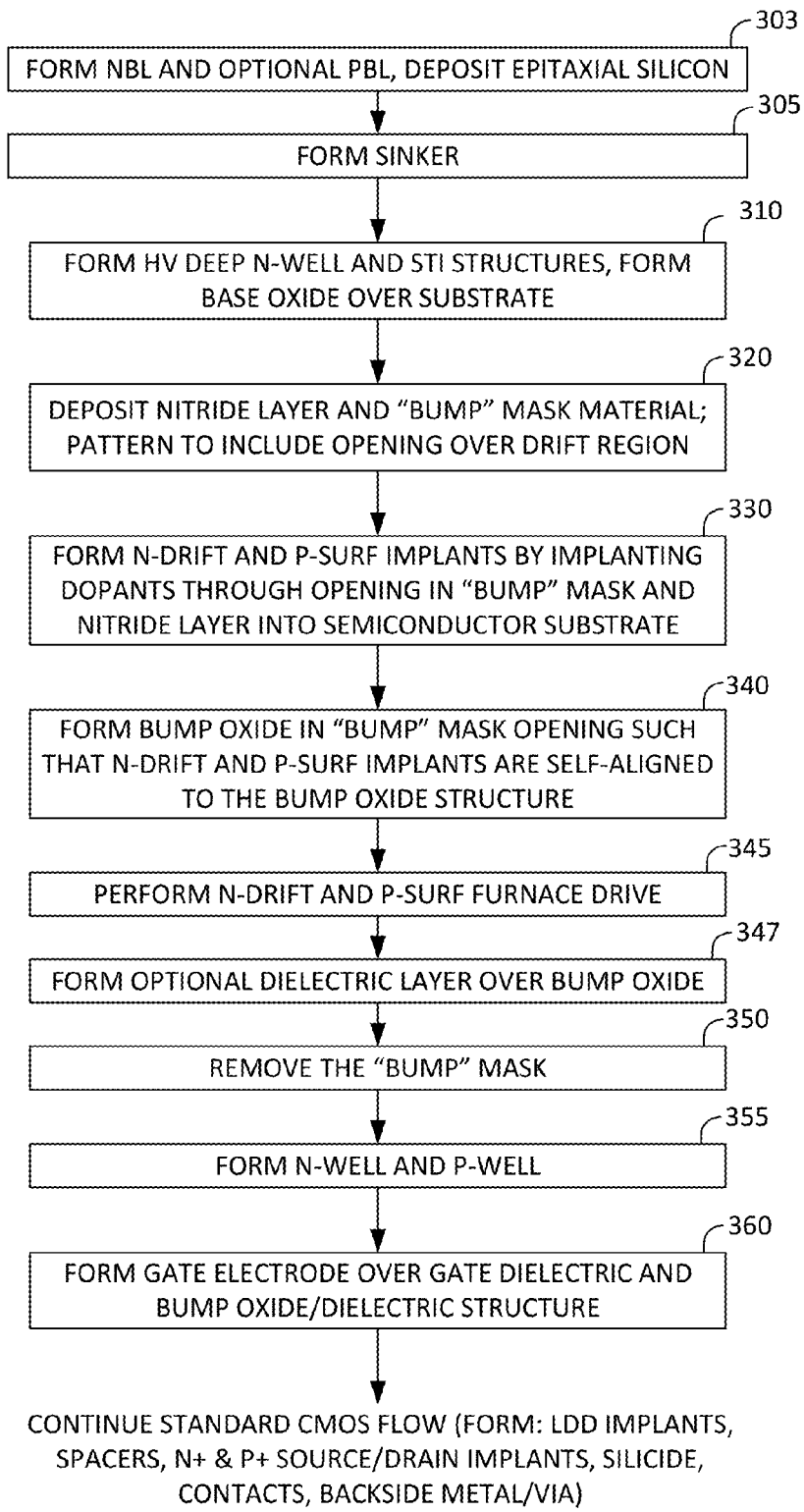
FIG. 2 is simplified flow diagram showing a generalized method for producing the double-RESURF LDMOS transistor of FIG. 1 according to another embodiment of the present invention.

FIG. 2 is a flow diagram showing a simplified method of fabricating double-RESURF LDMOS transistor 200 (FIG. 1) on a semiconductor structure according to a generalized embodiment of the present invention. Referring to block 303 at the top of FIG. 2 and to FIG. 1, the method begins by implanting dopants associated with N-buried layer (NBL) 250 and optional P-buried layer (PBL) 256 in semiconductor substrate 201 (e.g., monocrystalline silicon), then forming an epitaxial silicon (Epi) layer 201B on substrate 201. Next, sinker 244 is formed in Epi layer 201B (block 305), and then HV deep N-well 220, STI structures 203, and base oxide layer 213 are formed on Epi layer 201B (block 310). As indicated block 320, a "bump" mask is then formed over Epi layer 201B by depositing a (hard) nitride layer and a mask material, and then patterning these layers to define an opening over drift region 215. Dopants are then implanted through the bump mask opening to form N-drift implant 252 and P-surf implant 245 (block 330), and then bump oxide 211 is formed in the mask opening such that it is self-aligned with N-drift implant 252 and P-surf implant 245 (block 340). A special thermal treatment (furnace drive) is performed in accordance with a thermal budget to achieve, e.g., diffusion of the dopants forming N-drift implant 252 into the birds beak portion of bump oxide 211 (block 345), and then optional dielectric structure 212 is formed in the bump mask opening (block 347). By forming both n-type drift implant 252 and the p-type surface field implant 254 using the same "bump" mask used to form gate dielectric structure 210, the present invention facilitates fabrication of a double-RESURF LDMOS transistor having the enhanced performance characteristics described above in a highly efficient manner (i.e., by avoiding the need to form and remove separate mask for each of n-type drift implant 252, p-type surface field implant 254 and gate dielectric structure 210.

Subsequently, the "bump" mask is removed (block 350), and then predominantly standard CMOS processing is used to complete the fabrication of double-RESURF LDMOS transistor 200 (and "normal" CMOS transistors 260 and 265, shown in FIG. 1). For example, after removal of the bump mask, N-well and P-well formation is performed (as indicated in block 355, FIG. 2) to provide N-well 230N and P-well 230P of "normal" CMOS transistors 260 and 265 (as shown in FIG. 1). Gate electrode 245 is formed over base dielectric layer 213 and gate dielectric structure 210 (block 360) using the same standard CMOS polysilicon deposition/etch processes that are used to form gate structures 225 and 235 for low power CMOS transistors 260 and 265 (shown in FIG. 1). Subsequent CMOS processing includes simultaneously forming LDD implants in all transistors (e.g., LDD implants 223 and 224 of transistor 260, LDD implants 233 and 234 of transistor 265, and LDD implant 243 of LDMOS transistor 200, all shown in FIG. 1), simultaneously forming sidewall spacers in all transistors (e.g., spacers 247 of transistors 260 and 265 and LDMOS transistor 200, all shown in FIG. 1), simultaneously forming N+ and P+ implants in all transistors (e.g., P+ implants 221 and 222 of transistor 260, N+ implants 231 and 232 of transistor 265, and P+ implants 240 and N+ implants 241, 242 and 249 of LDMOS transistor 200, all shown in FIG. 1), simultaneously forming silicide regions on all transistors (e.g., silicide regions 248 of transistors 260 and 265 and silicide regions 248S and 248D of LDMOS transistor 200, all shown in FIG. 1), and then forming contacts, backside metal and vias according to known techniques.

Figure 3A:
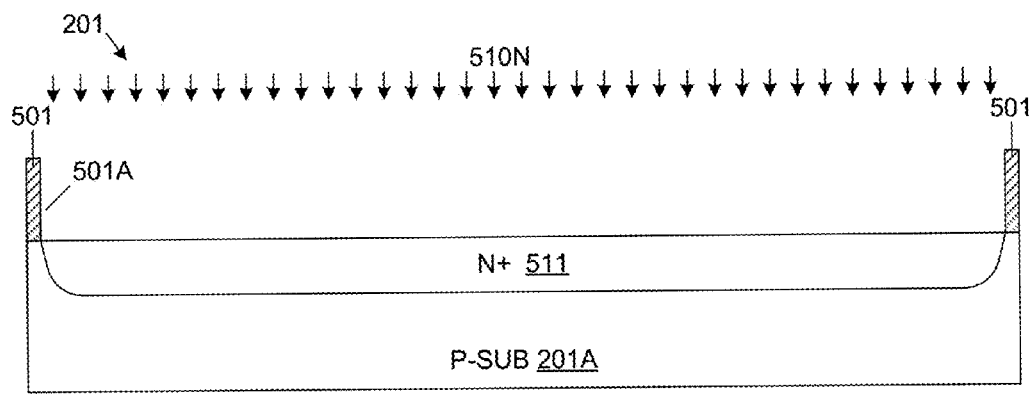
FIGS. 3(A), 3(B), 3(C), 3(D), 3(E), 3(F), 3(G), 3(H), 3(I), 3(J), 3(K), 3(L), 3(M), 3(N), 3(O), 3(P), 3(Q), 3(R) and 3(S) are simplified cross sectional views of a double-RESURF LDMOS transistor LDMOS transistor during various stages of fabrication in accordance with another embodiment of the present invention.
Figure 3B:
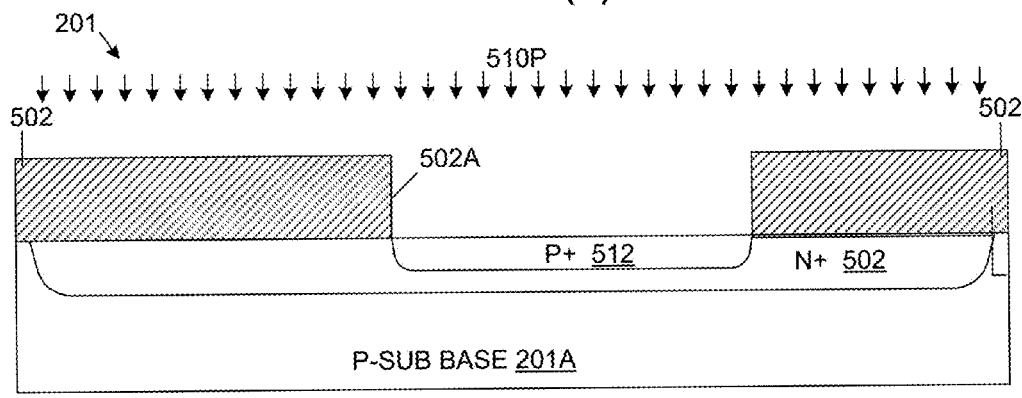
Figure 3C:
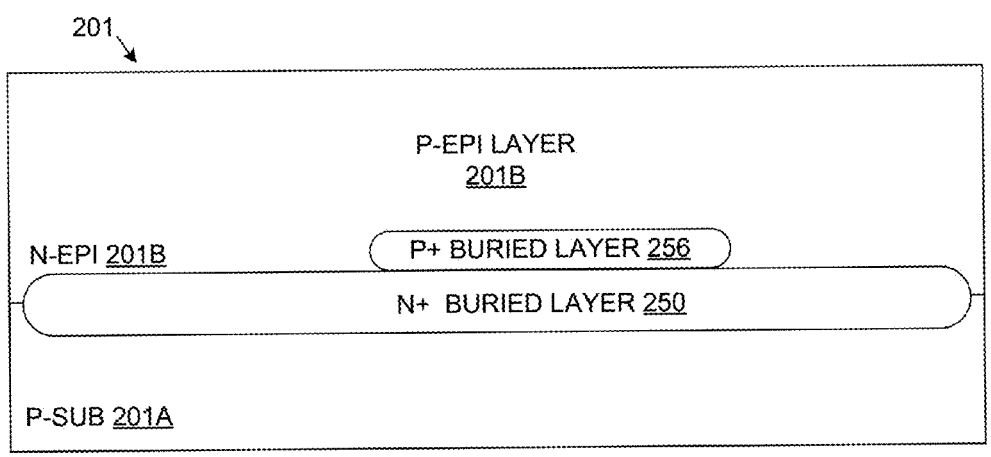
Figure 3D:
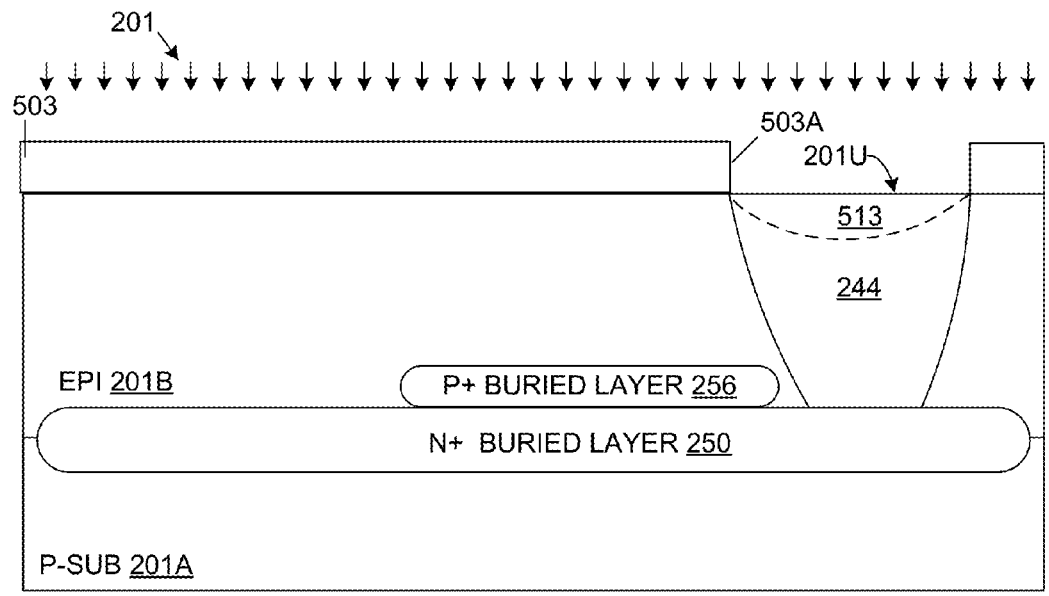
Figure 3E:
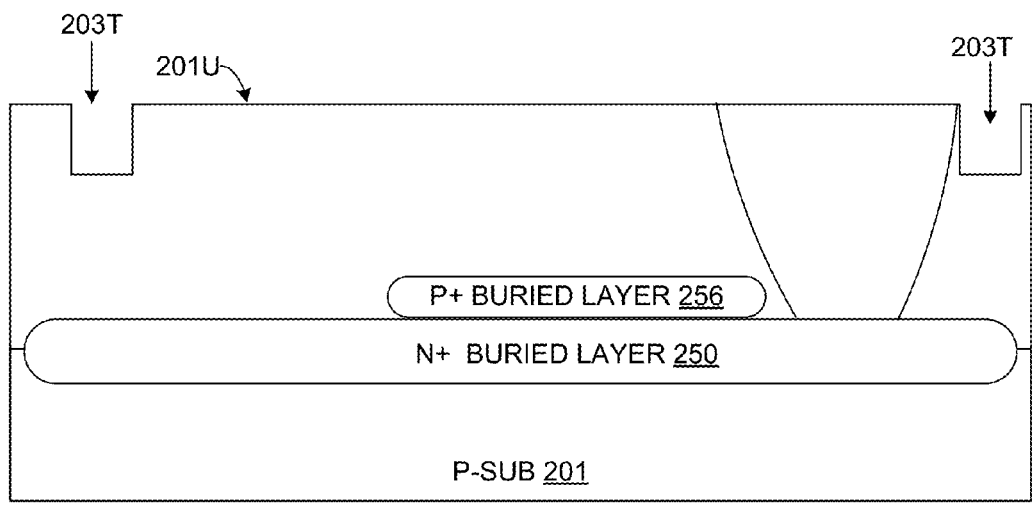
Figure 3F:
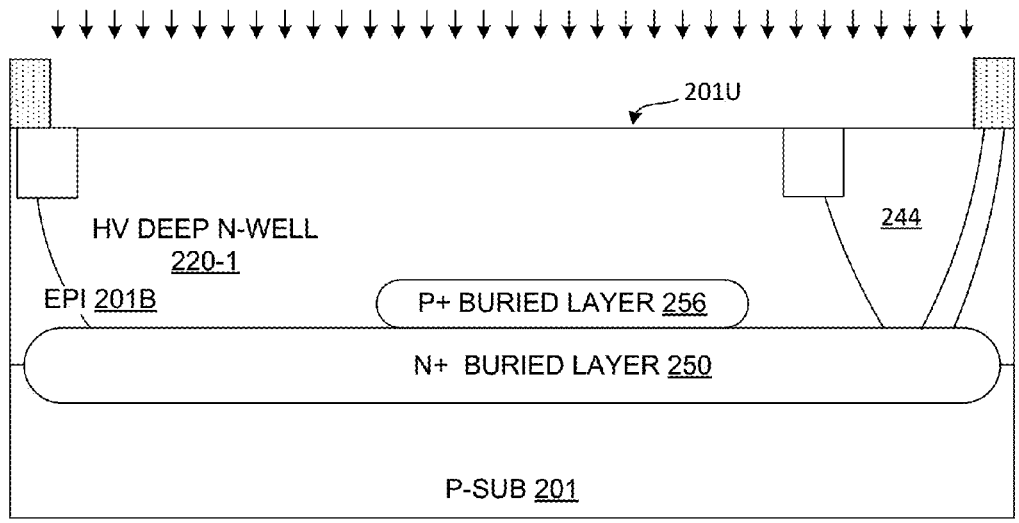
Figure 3G:
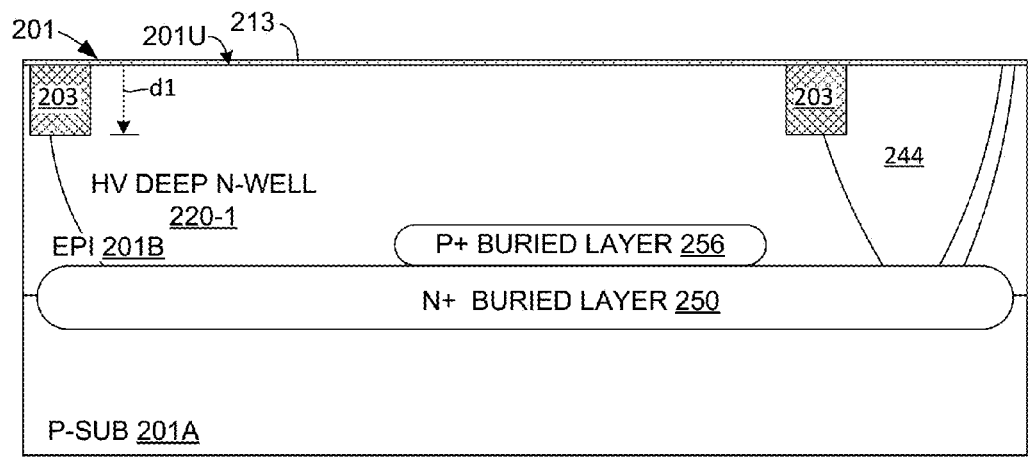
Figure 3H:
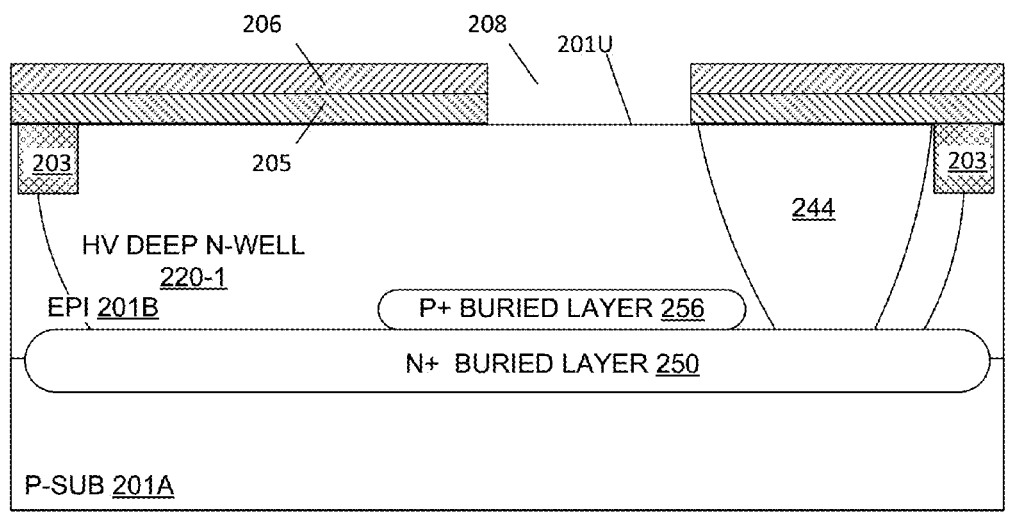
Figure 3I:
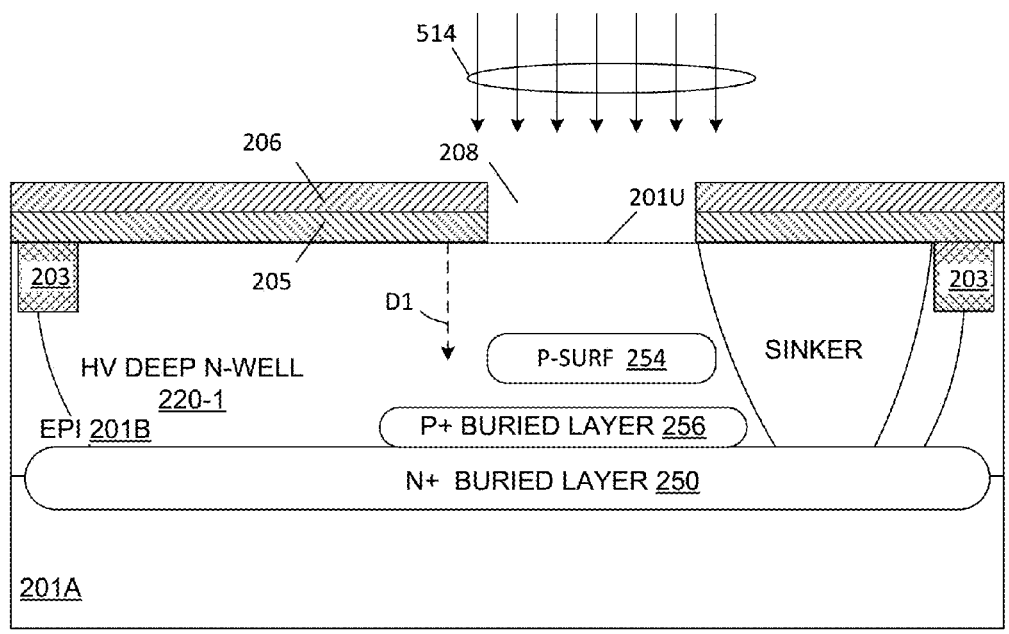
Figure 3J:
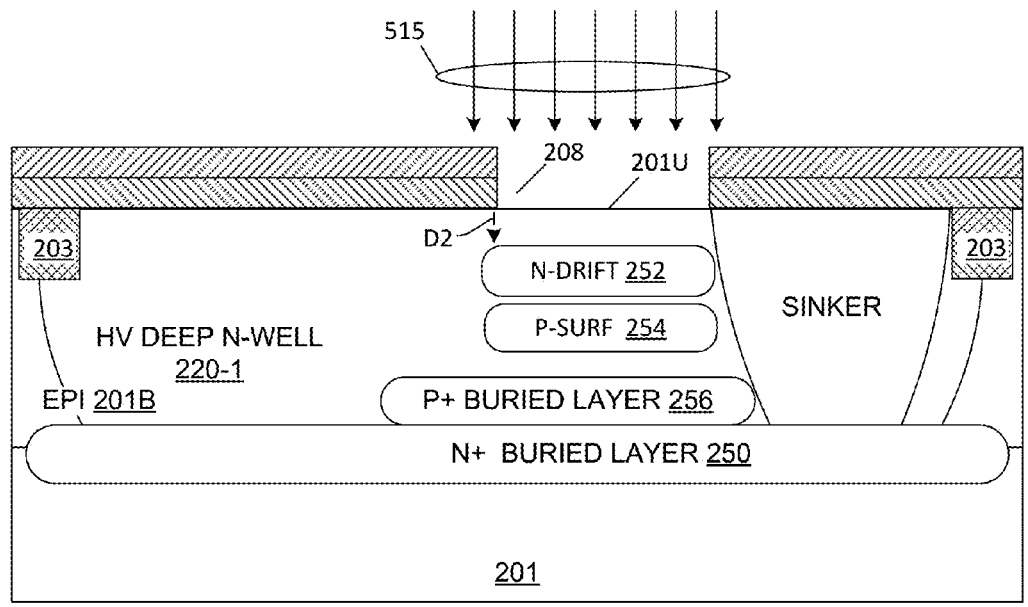
Figure 3K:
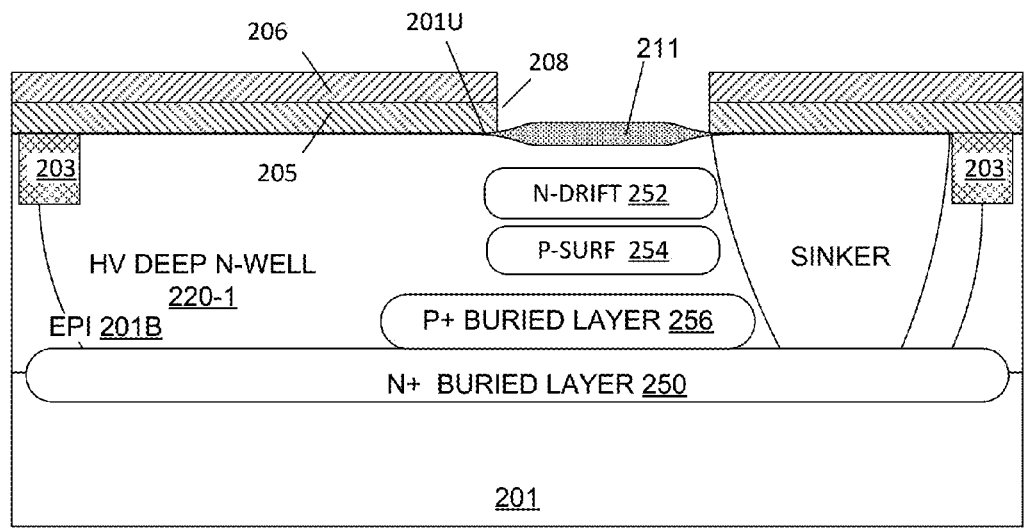
Figure 3L:
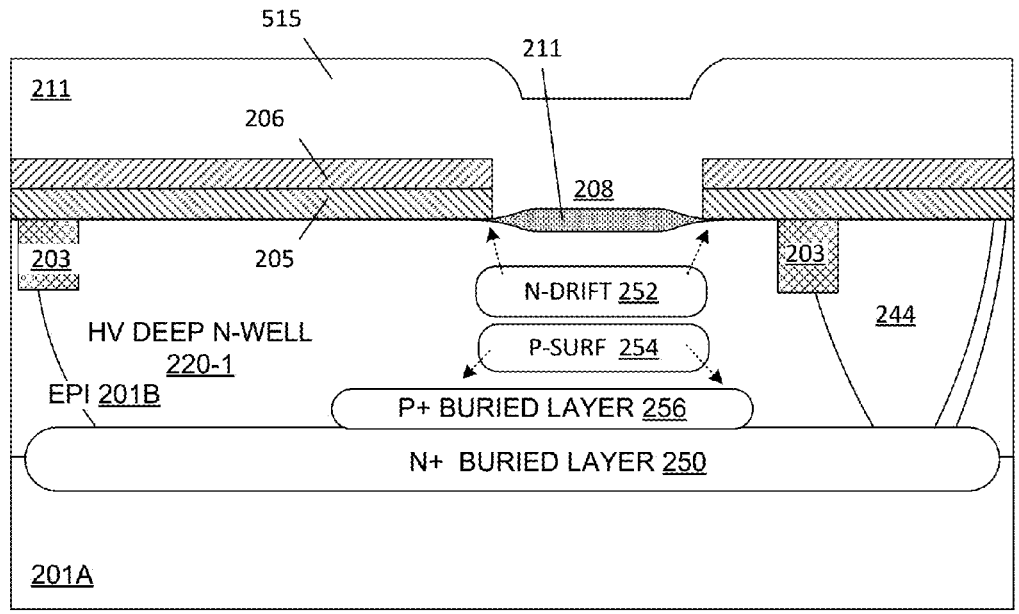
Figure 3M:
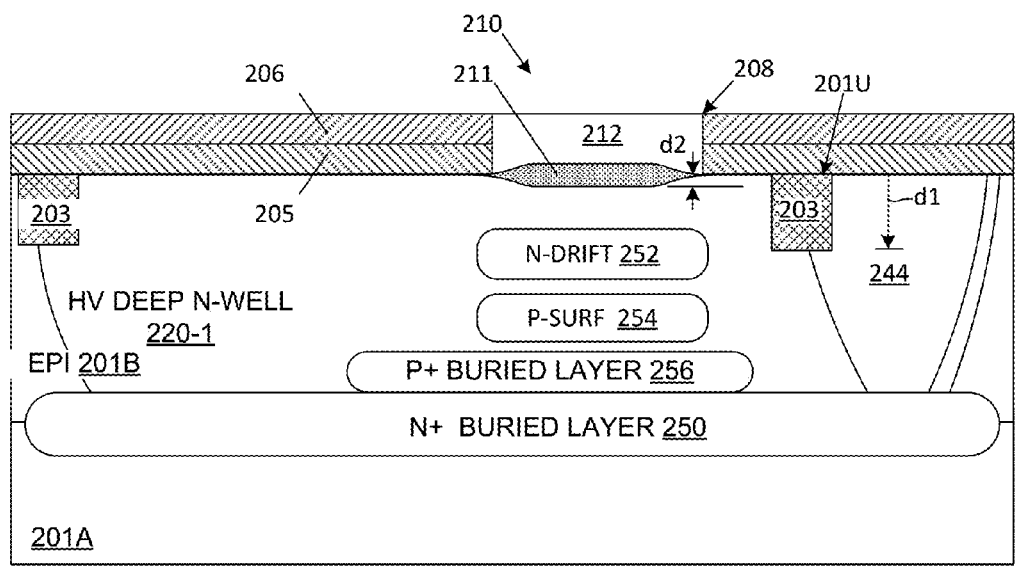
Figure 3N:
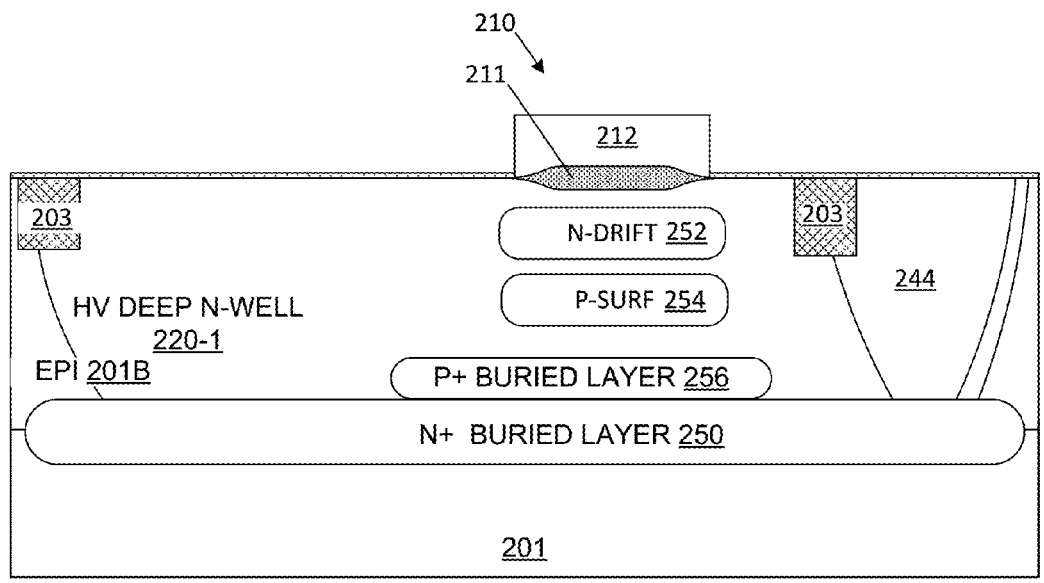
Figure 3O:
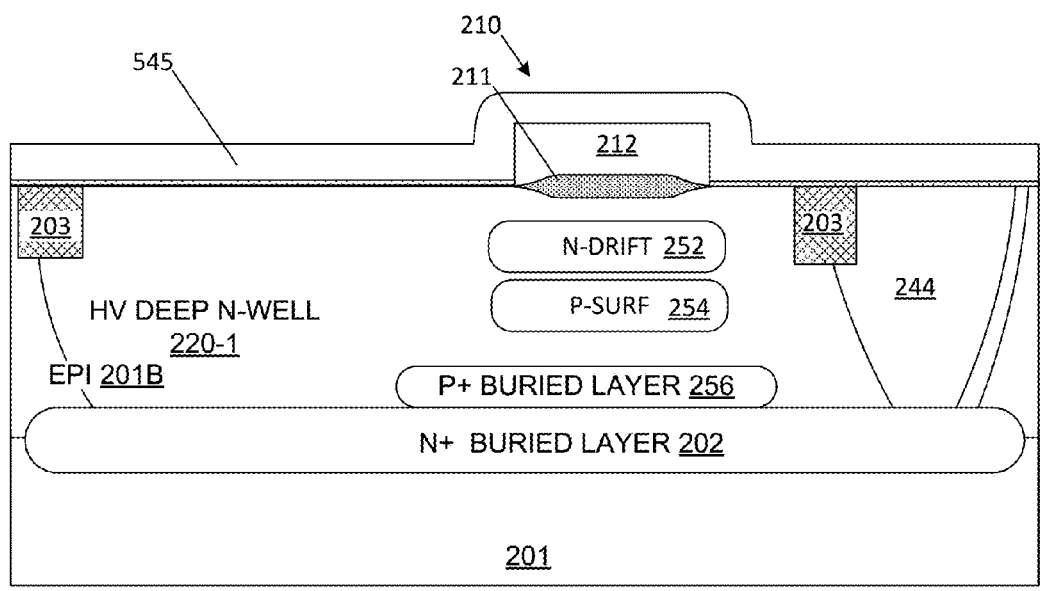
Figure 3P:
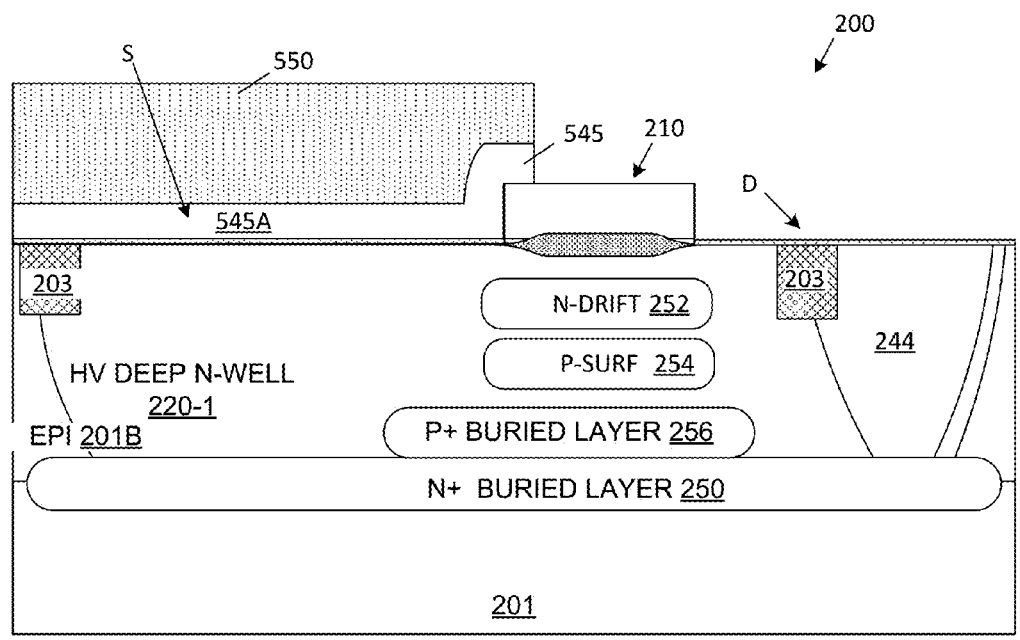
Figure 3Q:
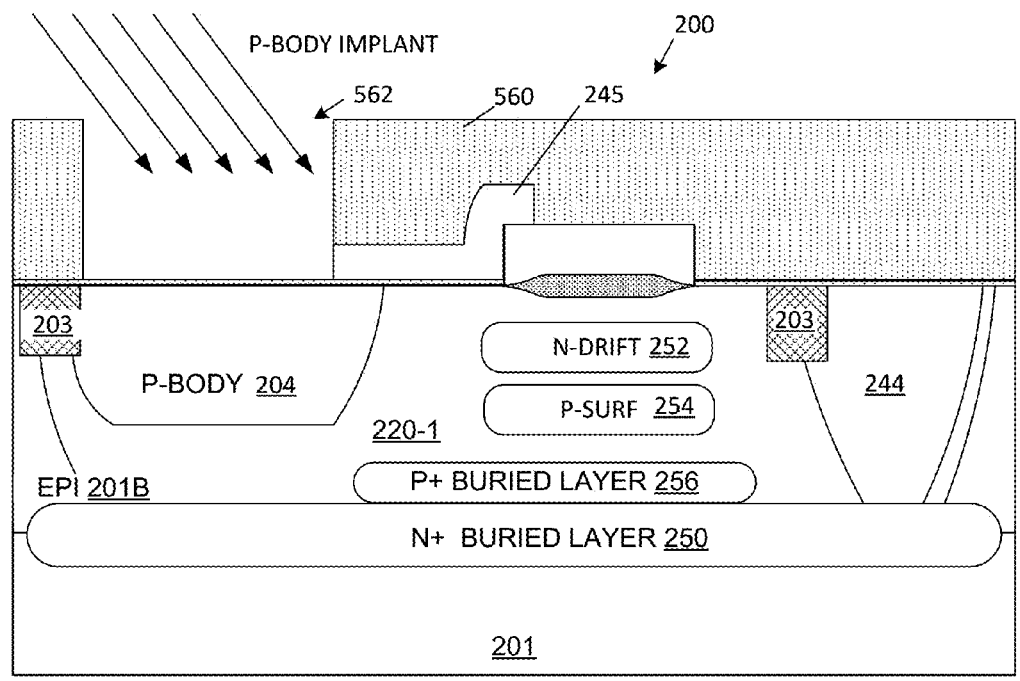
Figure 3R:
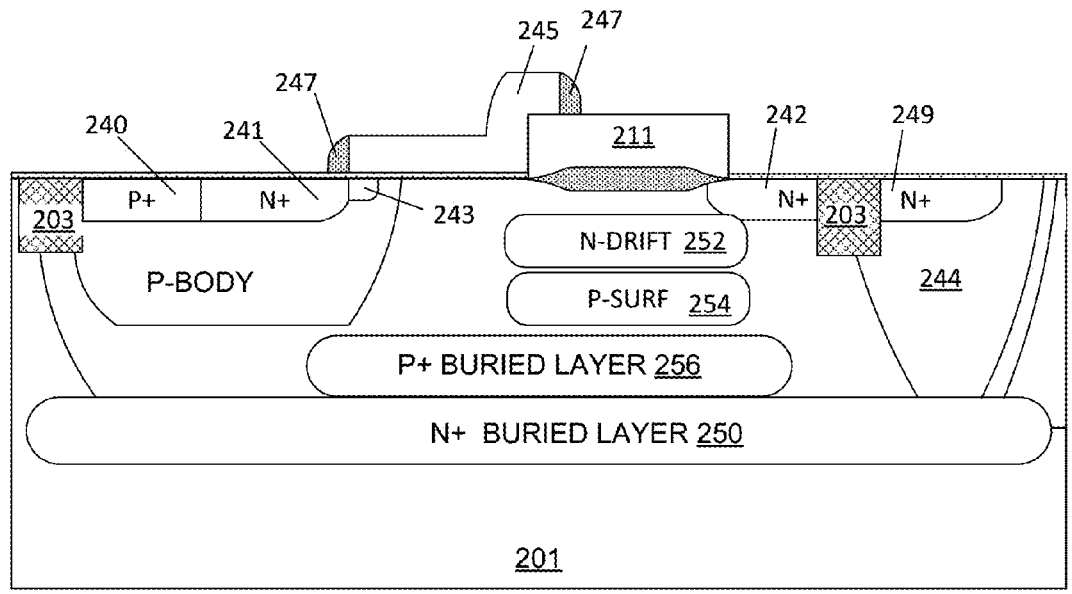
Figure 3S:
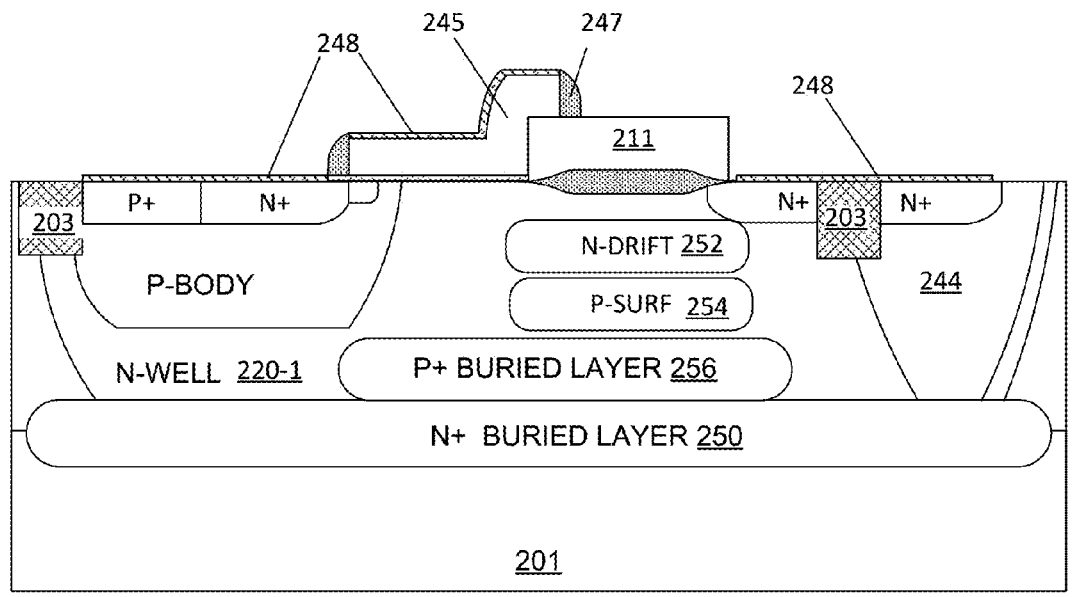

FIGS. 3(A) to 3(S) are cross sectional views of LDMOS transistor 200 (FIG. 1) during various stages of fabrication consistent with the flow diagram of FIG. 2 in accordance with an exemplary detailed embodiment of the present invention.

As illustrated in FIGS. 3(A) to 3(C), the various semiconductor structures forming LDMOS transistor 200 are formed on a semiconductor substrate 201 made up of a p-type monocrystalline silicon "base" substrate 201A and an epitaxial silicon layer 201B. In an alternative embodiment, base substrate 201A may comprise epitaxial material formed over a third substrate (not shown). Moreover, substrate 201 may have an n-type conductivity in an alternate embodiment. Zero layer (ZL) lithography and etch steps (not shown) are performed, thereby forming a pattern of trenches (having an exemplary depth of 1200 Angstroms) that acts as a marking layer for alignment purposes during subsequent process steps.

As illustrated in FIG. 3(A), an N+ buried layer mask 501 is formed over the substrate 201 using conventional photolithography. Mask 501 defines an opening 501A that exposes the general location where the HV deep N-well region 220 FIG. 1) is to be formed. An N+ dopant material 510N is then directed onto mask 501 and enters substrate 201A through opening 501A, thereby forming an N+ implant in region 511 of substrate 201A. In one embodiment, the N+ implant is performed by implanting Arsenic (As) or Antimony (Sb) at a dosage of about $3 \times 10^{15}$ cm$^{-3}$ and an energy of about 70 KeV. Note that the second portion of the integrated circuit chip (where the low voltage CMOS transistors and the LDMOS transistor will be formed) is covered by mask 501.

As illustrated in FIG. 3(B), the N+ buried layer mask is then removed and a P+ buried layer mask 502 is formed over the substrate 201 using conventional photolithography, where mask 502 defines an opening 502A that exposes the general location where the P+ buried layer 256 (see FIG. 1) is to be formed. A P+ dopant material 510P is then directed onto mask 502 and enters substrate 201A through the corresponding opening, thereby forming a P+ implant in region 512 of substrate 201A. In one embodiment, the P+ implant is performed by implanting Boron (B) at a dosage of about 3e15 cm$^{-3}$ and an energy of about 120 KeV. Note that N+ region 511 overlaps P+ region 512.

As illustrated by FIG. 3(C), the P+ buried layer mask is then removed, and an epitaxial silicon layer 201B is grown over base structure 201A. In one embodiment, epitaxial silicon layer 201B has a thickness of about 6 microns and a resistivity of about 10 Ohm-cm. Although epitaxial layer 201B has a P-type conductivity in the described embodiments, it is understood that epitaxial layer 503 can have an n-type conductivity in other embodiments. After forming epitaxial silicon layer 201B, an anneal process is performed to cause the N+ and P+ implants to diffuse upward into epitaxial silicon layer 201B, thereby forming P+ buried layer 256 and N+ buried layer 250. Note that the selected P+ implant material (e.g., Boron) diffuses at a faster rate than the N+ implant material (e.g., Sb), and so desirably forms PBL 256 above NBL 250.

As illustrated in FIG. 3(D), a sinker mask 503 is then formed over upper surface 201U of substrate 201 using conventional photolithography, where sinker mask 503 defines an opening 503A that exposes the general location where N-type sinker region 244 is to be formed. An N-type dopant material is then directed onto mask 503 and enters substrate 201A through opening 503A, thereby forming an N-type implant in region 513 of epitaxial layer 201B. In one embodiment, the N-type implant is performed by implanting Phosphorous at a dosage of about $3 \times 10^{15}$ cm$^{-3}$ and an energy of about 150 KeV. A suitable sinker drive anneal process is then performed to cause diffusion of the N-type implant to form sinker region 244 extending between upper surface 201U and N-type buried layer 250.

FIG. 3(E) depicts subsequent active area lithography that is then performed, wherein the active area lithograph is aligned with the previously formed zero layer patterns. Active area lithography defines trenches 203T in the areas where field oxide regions (e.g., STI regions 203 in FIG. 1) are formed.

As illustrated in FIG. 3(F), a high voltage deep N-well implant and drive is then performed in epitaxial layer 201B by masking, implant, and thermal diffusion according to known techniques to form HV deep N-well region 220, which extends from upper surface 201U to P+ buried layer 256 and N+ buried layer 250, and encompasses sinker region 244.

As illustrated by FIG. 3(G), field oxide regions 203 and surface oxide layer 213 are simultaneously formed in epitaxial layer 201B, using conventional processing steps. Field oxide regions 203 can be, for example, shallow trench isolation (STI) regions, local oxidation of silicon (LOCOS) regions, or poly buffered local oxidation of silicon (PBLOCOS) regions. In the described example, field oxide regions 203 are STI structures having a depth of about 3500 Angstroms, although other depths are possible. Field oxide regions 203 define the location of double-RESURF LDMOS transistor 200 in the manner described above in connection with FIG. 1.

FIG. 3(H) illustrates the formation of a "bump" mask according to an embodiment of the present invention. As illustrated in FIG. 3(H), a silicon oxide (SiO$_2$) screening layer 205 is thermally grown over the upper surface 201U. A sacrificial silicon nitride (SiN$_4$) layer 206 is then deposited over silicon oxide layer 205 using a standard chemical vapor deposition (CVD) process. In the described embodiment, silicon oxide layer 205 has a thickness of about 80 Angstroms and silicon nitride layer 206 has a thickness in the range of about 500 to 2000 Angstroms. An opening 208 is then formed through silicon oxide layer 205 and silicon nitride layer 206. This opening 208 is created by forming a photoresist mask (not shown) over silicon nitride sacrificial layer 206, wherein the photoresist mask has an opening which exposes the region where opening 208 is subsequently formed; performing a dry etch through the opening in the photoresist mask, thereby creating opening 208, and then removing the photoresist mask. The location of opening 208 is selected to correspond with the desired location of gate dielectric structure 210 (see FIG. 1).

As illustrated FIG. 3(I), a high energy implant process is then performed in which a P-type implant material 514 (e.g., Boron) is directed through opening 208 into expitaxial layer 201B such that it forms p-type surface field (P-surf) implant 254 at a relatively deep (first) distance D1 below the upper surface 201U. The "bump" mask formed by silicon oxide layer 205 and silicon nitride layer 206 prevents the P-surf implant material from entering other areas of substrate 201.

In one embodiment, the P-surf implant is performed by implanting Boron at a dosage of about $1 \times 10^{13}$ cm$^{-3}$ and an energy of about 450 KeV.

Next, as illustrated FIG. 3(J), a low energy implant process is then performed in which an N-type implant material 515 (e.g., Phosphorus or Arsenic) is directed through opening 208 into epitaxial layer 201B such that it forms N-type drift (N-drift) region 252 at a relatively shallow (second) distance D2 below the upper surface 201U, where distance D2 is closer to upper surface 201U than distance D1 such that N-drift implant region 252 is formed above P-surf region 256. In one embodiment, the N-drift implant is performed by implanting Phosphorous at a dosage of about $1 \times 10^{13}$ cm$^{-3}$ and an energy of about 75 KeV.

FIGS. 3(K) to 3(M) illustrate the subsequent formation of gate dielectric structure 210 (see FIG. 1) according to an embodiment of the present invention.

Referring to FIG. 3(K), a thermal oxidation step is performed to form a shallow field oxide (LOCOS) region (referred to herein as "bump oxide") 211 on the portion of upper surface 201U that is exposed through opening 208. In the described embodiment, bump oxide 211 has a total thickness of about 500 Angstroms. Thus, bump oxide 211 extends about 250 Angstroms above and 250 Angstroms below the upper surface level of HV deep N-well region 220. In one embodiment of the present invention, bump oxide 211 has a thickness in the range of about 200 to 500 Angstroms. In other embodiments, the thermal oxidation step is controlled such that bump oxide 211 has other thicknesses. In a particular embodiment, bump oxide 211 has a thickness less than 500 Angstroms, such that bump oxide 211 does not adversely affect the shape of the resulting dielectric structure. It is important to note that bump oxide 211 has thickness that is substantially less than the thickness of STI regions 203 because, unlike STI regions 203 that perform isolation functions, bump oxide 211 serves to maintain high source/drain voltages when 0V is applied to gate electrode 245. In accordance with one embodiment, bump oxide 211 has a thickness at least about ten times less than a thickness of STI regions 203. It is also important to note that the bump oxide 211 exhibits a curved birds beak profile, rather than the sharp edges of STI regions 203.

Referring to block 345 in FIG. 2, following the oxidation process used to form bump oxide 211, a furnace drive is performed in accordance with a predetermined thermal budget to drive the N-drift dopants over to the birds beak area, and to drive the P-surf dopants into PBL 256 to ensure a good electrical contact between P-surf implant 254 and the subsequently formed P-body region (described below).

In one embodiment the furnace drive is performed at about 1150° C. for 20 minutes, and can be combined with the oxidation step (note, however, that the furnace drive is performed in non-oxidizing ambient, such as N$^2$ gas, not in oxidizing ambient species such as O$^2$ or H$^2$O, to avoid forming oxidation that could result in forming bump oxide 211 that is too thick, and would couple the necessary temperature to anneal with the oxide bump thickness).

FIG. 3(L) depicts the subsequent optional deposition of a dielectric layer 515 over sacrificial silicon nitride layer 206 and contacts bump oxide 211. Note that dielectric layer 515 may be omitted if bump oxide 211 provides a sufficient offset between the gate electrode and the drift region. In one embodiment, dielectric layer 515 is formed by the chemical vapor deposition (CVD) of silicon oxide. The thickness of dielectric layer 515 is controlled to be sufficient to completely fill opening 208.

As illustrated in FIG. 3(M), an optional chemical-mechanical polishing (CMP) step is performed to remove the portion of the dielectric layer material (when present) that extends above sacrificial silicon nitride layer 206, thereby forming raised dielectric structure 212. The CMP step is stopped on sacrificial silicon nitride layer 206, by a self-aligned CMP process resulting in precise control of the thickness of gate dielectric structure 210 formed by bump oxide 211 and raised dielectric structure 212. At the end of the CMP step, the only remaining portion of dielectric layer 515 (shown in FIG. 3(L)) exists within opening 208. Thus, the combined thickness of bump oxide 211 and raised dielectric structure 212 above the upper surface of HV deep N-well region 220 is defined by the thickness of silicon oxide layer 205 and sacrificial silicon nitride layer 206. In the described embodiment, the combined thickness of bump oxide 211 and raised dielectric structure 212 (i.e., the thickness of gate dielectric structure 210) is in the range of about 700 to 2000 Angstroms.

As shown in FIG. 3(N), the "bump" mask is then removed from the upper surface of substrate 201. First, silicon nitride layer (shown in FIG. 3(M)) is removed, e.g., by etching with hot phosphoric acid. This etch is highly selective to silicon oxide, and does not remove bump oxide 211 or raised dielectric structure 212. Silicon oxide layer 205 (shown in FIG. 3(M)) is then removed by a conventional etch in diluted HF or in buffered HF. Etch time is chosen according to the thickness of screening oxide 205. Note that the exposed upper surface of raised dielectric structure 212 is partially removed during this etch, such that the thickness of raised dielectric structure 212 is reduced. However, the controlled nature of this etching process allows the final thickness of raised dielectric structure 212 to be precisely controlled.

Referring to FIG. 3(O), a conductively doped polysilicon layer 545, which will eventually form gate electrode 245 of LDMOS transistor 200 (and the gate electrodes of other transistors formed on substrate 201), is then formed over base oxide layer 213 and gate dielectric structure 210 using known techniques.

As shown in FIG. 3(P), a first gate line photoresist mask 550 is then formed over polysilicon layer 545, and a first etch is performed through the openings of first gate line mask 550 to remove the portion of polysilicon layer 525 located over a portion of gate dielectric structure 210 and over the drain (D) side of LDMOS transistor 200. Note that gate line mask 550 covers the source side of LDMOS transistor 200, such that polysilicon region 545A remains over the source (S) side after the first etch is completed.

As illustrated in FIG. 3(Q), the first gate line photoresist mask is then removed, and a second gate line photoresist mask 560 is formed over the resulting structure. The second gate line mask 560 defines an opening 562 that exposes a portion of the polysilicon layer located over the source side of LDMOS transistor 200. An etch is then performed through opening 562 of the second gate line photoresist mask 560, thereby removing the exposed portions of the polysilicon layer, whereby the remaining portion of etched polysilicon layer forms gate electrode 245 of LDMOS transistor 200.

As also indicated in FIG. 3(Q), a p-type body implant is then performed at an angle through opening 562 of second gate line mask 560, thereby forming p-body implant 204 (i.e., such that p-type body implant 204 is aligned with the left-side edge of gate electrode 245 by way of being implanted through opening 562 of second gate line photoresist mask 560). The p-type body implant is described in more detail in commonly owned U.S. Pat. No. 7,575,977, which is hereby incorporated by reference.

The second gate line mask 560 is then stripped, and conventional CMOS front-end and back-end processes are used to complete LDMOS 200 according to known techniques. More specifically, referring to FIG. 3(R), source/drain extension implants are performed to create lightly doped source/drain extension regions in low voltage transistors 260 and 265 (shown in FIG. 1), and lightly doped source extension region 243 in LDMOS transistor 200. Dielectric sidewall spacers 247 are then formed adjacent to the gate electrodes, including gate electrode 245 of LDMOS transistor 200. A P+ implant is performed to create p-type source/drain contact regions (e.g., P+ body contact region 240), and an N+ implant is performed to create n-type source/drain contact regions (e.g., N+ contact regions 241 and 242, which are respectively formed on the source and drain sides of LDMOS 200). As indicated in FIG. 3(S), the exposed portions of the gate oxide regions located over the source and drain portions of LDMOS 200 are then removed, and metal salicide regions 248 are formed over the resulting source and drain regions, and over gate structure 245, using a conventional salicide process. A standard CMOS process is then used to form the remaining backend structures (e.g., contacts, metals and vias), which are not shown for the sake of brevity.

Figure 4:
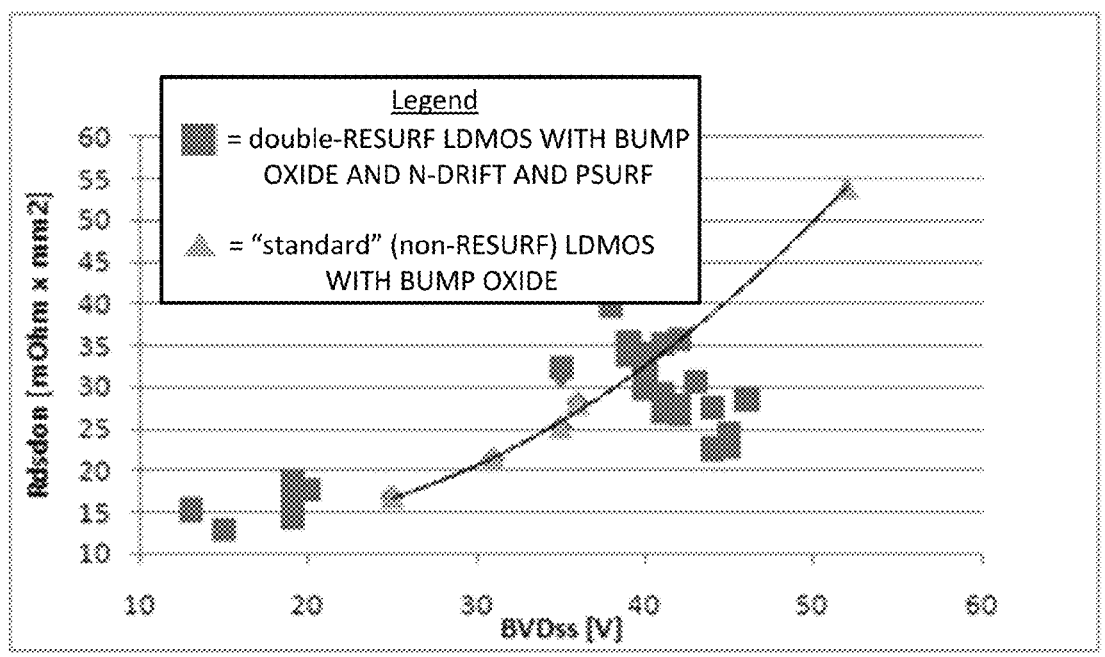
FIG. 4 is a chart showing measured performance characteristics of double-RESURF LDMOS transistors formed in accordance with the present invention.

Table 1 below compares the on-resistance ($R_{DSON}$) of a non-RESURF LDMOS transistor formed with a bump oxide structure (e.g., such as the LDMOS structures disclosed in co-owned and co-pending U.S. patent application Ser. No. 12/260,806, entitled "LDMOS Transistor Having Elevated Field Oxide Bumps And Method Of Making Same", which is incorporated herein by reference in its entirety) with double-RESURF LDMOS transistor 200, which is processed in accordance with the steps described in FIGS. 3(A) to 3(S) above. In both LDMOS structures the bump oxide is formed such that the BV for both transistors is 46 Volts. The double-RESURF architecture improves $R_{DSON}$ to BV by a factor of two. FIG. 4 is a chart demonstrating how the double-RESURF architecture of the present invention results in lower $R_{DSON}$ for a given breakdown voltage over non-RESURF LDMOS formed with a bump oxide structure. The chart indicates that the double-RESURF architecture facilitates using a smaller LDMOS device size (i.e., lower specific $R_{DSON}$) while maintaining the same BV of a large device.

TABLE 1

| Parameter | BUMP LDMOS | Double-RESURF BUMP LDMOS | Comment |
|---|---|---|---|
| $R_{DSON}$ | 42 mΩ * mm² | 21 mΩ * mm² | BV = 46 V $R_{DSON}$ Ratio = 2 |

The double-RESURF "bump" LDMOS transistors of the present invention exhibit substantially the same threshold voltage as conventional double-RESURF LDMOS transistors, but the double-RESURF "bump" LDMOS transistors of the present invention exhibit significantly lower on-resistances than conventional double-RESURF LDMOS transistors, which leads to higher drain current flow. The lower on-resistance is achieved because the bump oxide does not extend into the substrate as deeply as the field oxide region of conventional LDMOS transistors. Also, the hot carrier degradation is more than three orders of magnitude better in the double-RESURF "bump" LDMOS transistors of the present invitation.

Although field plating techniques have been used in the past, it is important to note that the field plating technique of the present invention will provide improved $R_{DSON}$/BVdss ratios when compared with conventional field plating techniques. This is because conventional field plating techniques have been applied to conventional LDMOS transistors, which are formed using the relatively thick conventional dielectric layers available in the CMOS platform (see, e.g., LOCOS). As a result, a relatively high voltage must be applied to adjust the field under the relatively thick dielectric layer in order to obtain any improvement in the $R_{DSON}$/BVdss ratio. However, the double-RESURF "bump" LDMOS transistor of the present invention allows for optimization of the thickness of the dielectric bump created by the combination of oxide/dielectric structures 211 and 212. By optimizing the thickness of the dielectric bump, the $R_{DSON}$/BVdss ratio can advantageously be minimized.

Although the invention has been described in connection with several embodiments, it is understood that this invention is not limited to the embodiments disclosed, but is capable of various modifications, which would be apparent to a person skilled in the art.

Figure 5:
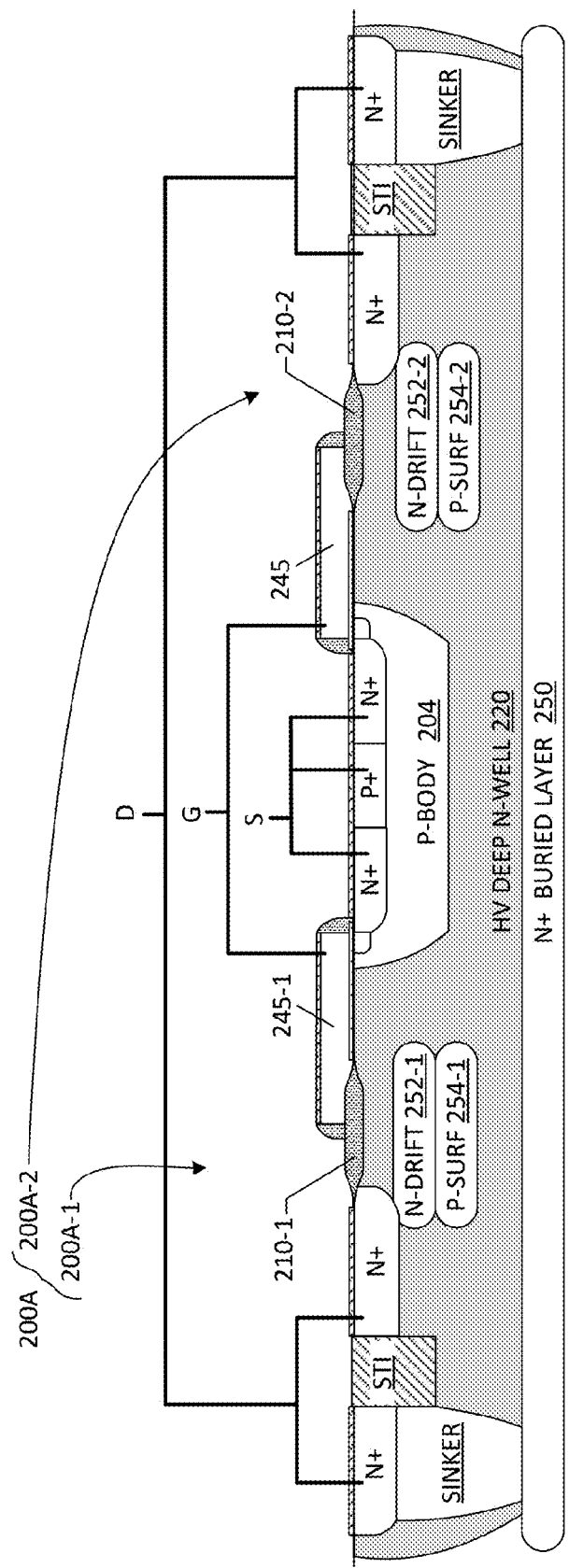
FIG. 5 is a cross-sectional view showing a LDMOS transistor in accordance with another embodiment of the present invention.
Figure 6:
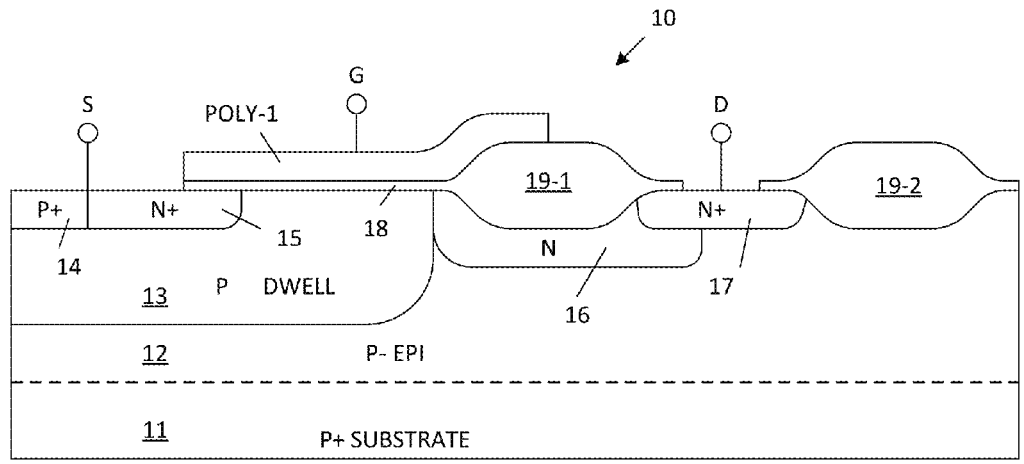
FIG. 6 is a cross-sectional view showing a conventional RESURF LDMOS transistor.
Figure 7:
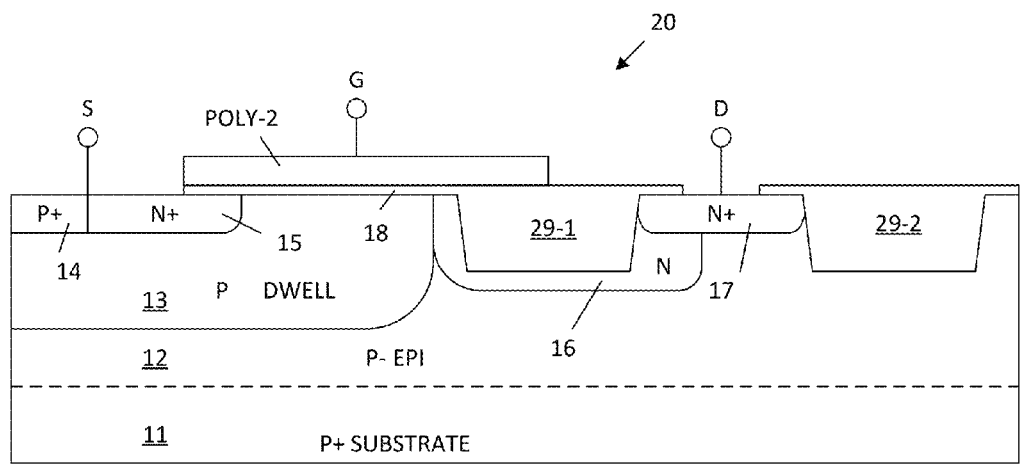
FIG. 7 is a cross-sectional view showing another conventional RESURF LDMOS transistor.
Figure 8:
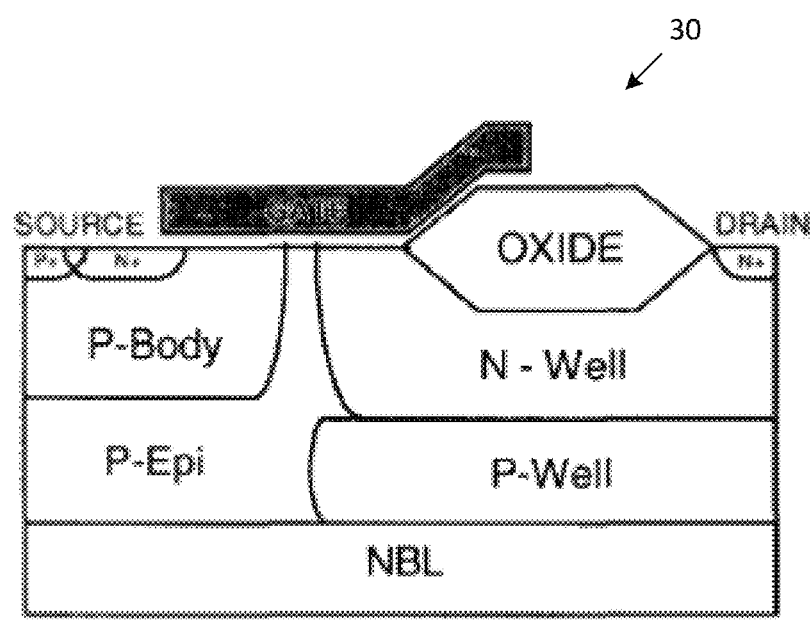
FIG. 8 is a cross-sectional view showing a conventional double-RESURF LDMOS transistor.

FIG. 5 shows an exemplary LDMOS transistor 200A according to an exemplary embodiment that illustrates how certain novel aspects of the present invention may be utilized (and others omitted) to produce beneficial LDMOS devices. Similar to the embodiments described above, LDMOS transistor 200A is formed in a HV deep N-well 220 that is formed over an N+ buried layer 250. LDMOS transistor 200A includes two commonly connected transistor portions 200A-1 and 200A-2 that share a central P-body region 204 and respectively includes N-drift implants 252-1 and 252-2 and P-surf implants 254-1 and 254-2 that are formed below gate dielectric structures 210-1 and 210-2. Drain (D), source (S) and gate (G) signals are applied as indicated during operation, whereby current simultaneously flows through both transistor portions 200A-1 and 200A-2 in opposite directions away from P-body region 204.

In accordance with a first modification from the earlier embodiment, LDMOS transistor 200A omits a P+ buried layer (e.g., P+ buried layer 256 shown in FIG. 1). Although this arrangement may be beneficially utilized, omission of the P+ buried layer disconnects P-body region 204 and P-surf implants 254-1/2, causing P-surf implants 254-1/2 to become capacitively coupled to various layers around surrounding them, with their potentials are floating accordingly. As a result the RESURF effect of LDMOS transistor 200A is smaller, and its BV is lower than that of a double-RESURF LDMOS transistor formed in accordance with the arrangement shown in FIG. 1. In addition, LDMOS transistor 200A has significant higher lock-up risk due to various parasitic bipolars turning on.

In accordance with another modification, LDMOS transistor 200A is formed without the two-part "stacked" gate dielectric structure utilized in the embodiment of FIG. 1. That is, transistor portions 200A-1 and 200A-2 respectively include polysilicon gate structures 245-1 and 245-2 that are partially formed on gate dielectric structures 210-1 and 210-2 that comprise only bump oxide structures (i.e., gate dielectric structures 210-1 and 210-2 comprise structures similar to those of bump oxide 211 of the embodiment shown in FIG. 1, but omit the dielectric structure 212). Alternatively, a "standard" gate dielectric structure might be used, where N-drift implant 252 and P-surf implant 254 are formed, for example, by way of a "no silicide" mask.

In accordance with yet other possible modifications, an LDMOS transistor is formed as described above with the N-drain implants formed using a tilt of 45 to 60° such that a portion of the N-drain implant material is are formed up to (i.e., the N-drain implants essentially contact) the birds beak regions of bump oxide 211. A similar result may be achieved by performing the N-drain implants through the nitride hard mask layer 205 (but not through resist layer 206).

Other modifications are also possible. For example, the conductivity types of the various semiconductor regions can be reversed with similar results. Thus, the invention is limited only by the following claims.

We claim:

1. A method of fabricating a double-RESURF LDMOS transistor on a semiconductor substrate, the method comprising:
    forming a well region in the semiconductor substrate using a dopant having a first conductivity type, and a base oxide layer on an upper surface of the semiconductor substrate over a first portion of the well region;
    forming a mask on the upper surface such that the mask defines an opening that exposes a portion of the upper surface located over a second portion of the well region;
    forming a drift implant region and a surface field implant in the semiconductor substrate by implanting associated dopant materials through the opening defined in the mask;
    forming a gate dielectric structure inside the opening defined in the mask such that both the drift implant region and the surface field implant are self-aligned to the gate dielectric structure;
    removing the mask; and
    forming a gate electrode on a portion of the base oxide layer and a portion of the gate dielectric structure.

2. The method of claim 1, further comprising:
    performing a first implant process during which an N-type dopant is implanted in a first region of a base semiconductor portion;
    performing a second implant process during which a P-type dopant is implanted in a second region of the base semiconductor substrate, the second region overlapping the first region;
    forming an epitaxial layer over the base portion, wherein said semiconductor substrate includes the base semiconductor portion and the epitaxial silicon layer, and the upper surface of the semiconductor substrate is formed by an exposed surface of the epitaxial layer; and
    annealing the semiconductor substrate such that the P-type dopant and the N-type dopant diffuse into the epitaxial layer to form a P-type buried layer and an N-type buried layer, wherein the P-type buried layer is disposed over the N-type buried layer,
    wherein forming the well region in the semiconductor substrate comprises forming the well region such that it extends from the upper surface to the N-type buried layer.

3. The method of claim 2, further comprising:
    performing a sinker implant process during which an N-type sinker dopant is implanted in a region of the epitaxial layer; and
    performing a sinker-drive anneal process in which the dopant diffuses through the epitaxial layer and forms a sinker implant process extending between the upper surface and the N-type buried layer.

4. The method of claim 1, wherein forming the mask comprises:

depositing a nitride hard mask layer over the upper surface of the semiconductor substrate;
depositing a photoresist layer on the nitride hard mask layer; and
patterning the nitride hard mask layer and the photoresist layer to define the opening.

5. The method of claim 4, wherein forming the drift implant region and the surface field implant comprises:
performing a high energy implant process through the opening during which a p-type dopant material is implanted in the semiconductor substrate and forms said surface field implant at a first distance below the upper surface of the substrate; and
performing a low energy implant process through the opening during which an n-type implant material is implanted in the semiconductor substrate and forms said drift implant region at a second distance below the upper surface of the substrate, the second distance between located between the first distance and the upper surface of the semiconductor substrate.

6. The method of claim 5, wherein forming the gate dielectric structure comprises forming a shallow field oxide region by thermally oxidizing the exposed portion of the drain diffusion region through the opening of the mask.

7. The method of claim 6, further comprising:
forming a plurality of shallow trench isolation (STI) regions in the epitaxial layer such that each said STI region extends at least a first depth below the upper surface of the semiconductor substrate,
wherein forming the gate dielectric structure comprises forming the shallow field oxide region such that it extends a second depth below the upper surface of the semiconductor substrate, wherein the first depth is greater than the second depth.

8. The method of claim 7, wherein forming forming the gate dielectric structure further comprises forming a dielectric structure on the shallow field oxide region such that edges of the dielectric structure are defined by inside walls of the opening defined in the mask, whereby the dielectric structure is entirely disposed over the shallow field oxide region.

9. The method of claim 8, wherein forming the dielectric structure on the shallow field oxide region comprises:
depositing a dielectric layer over the mask such a portion of the dielectric layer extends into the opening defined in the mask and contacts the thermal oxide region; and
removing portions of the dielectric layer that do not extend into the opening of the mask, wherein a remaining portion of the dielectric layer forms the dielectric structure.

10. The method of claim 9, wherein the step of removing portions of the dielectric layer that do not extend into the opening of the mask comprises performing chemical-mechanical polishing (CMP).

11. The method of claim 6, further comprising forming drain implants by directing an associated dopant material at a tilt angle in the range of 45 to 60° into the substrate such that the drain implants are formed up to a birds beak region of said shallow field oxide region.

12. The method of claim 6, further comprising forming drain implants by directing an associated dopant material through a portion of the nitride hard mask layer.

13. A method of fabricating a double-RESURF LDMOS transistor on a semiconductor substrate, the method comprising:
forming a deep N-well region in the semiconductor substrate, wherein a base oxide layer is disposed on an upper surface of the semiconductor substrate over a first portion of the deep N-well region;
forming a mask on the upper surface such that the mask defines an opening that exposes a portion of the upper surface located over a second portion of the deep N-well region;
forming an n-type drift implant region and a p-type surface field implant region in the semiconductor substrate by implanting associated n-type and p-type dopant materials through the opening defined in the mask;
forming a gate dielectric structure on the exposed portion of the upper surface such that both the n-type drift implant region and the p-type surface field implant region are self-aligned to the gate dielectric structure;
removing the mask; and
forming a gate electrode on a portion of the base oxide layer and a portion of the gate dielectric structure.

14. The method of claim 13, further comprising:
performing a first implant process during which an N-type dopant is implanted in a first region of a base semiconductor portion;
performing a second implant process during which a P-type dopant is implanted in a second region of the base semiconductor substrate, the second region overlapping the first region;
forming an epitaxial layer over the base portion, wherein said semiconductor substrate includes the base semiconductor portion and the epitaxial silicon layer, and the upper surface of the semiconductor substrate is formed by an exposed surface of the epitaxial layer; and
annealing the semiconductor substrate such that the P-type dopant and the N-type dopant diffuse into the epitaxial layer to form a P-type buried layer and an N-type buried layer, wherein the P-type buried layer is disposed over the N-type buried layer,
wherein forming the deep N-well region in the semiconductor substrate comprises forming the deep N-well region such that it extends from the upper surface to the N-type buried layer.

15. The method of claim 14, further comprising:
performing a sinker implant process during which an N-type sinker dopant is implanted in a region of the epitaxial layer; and
performing a sinker-drive anneal process in which the dopant diffuses through the epitaxial layer and forms a sinker implant process extending between the upper surface and the N-type buried layer.

16. The method of claim 13, wherein forming the mask comprises:
depositing a nitride hard mask layer over the upper surface of the semiconductor substrate;
depositing a photoresist layer on the nitride hard mask layer; and
patterning the nitride hard mask layer and the photoresist layer to define the opening.

17. The method of claim 16, wherein forming the n-type drift implant region and the p-type surface field implant region comprises:
performing a high energy implant process through the opening during which a p-type dopant material is implanted in the semiconductor substrate and forms said p-type surface field implant region at a first distance below the upper surface of the substrate; and
performing a low energy implant process through the opening during which an n-type implant material is implanted in the semiconductor substrate and forms said n-type drift implant region at a second distance below the upper surface of the substrate, the second distance between located between the first distance and the upper surface of the semiconductor substrate.

18. The method of claim 17, wherein forming the gate dielectric structure comprises forming a shallow field oxide region by thermally oxidizing the exposed portion of the drain diffusion region through the opening of the mask.

19. The method of claim 18, further comprising:
forming a plurality of shallow trench isolation (STI) regions in the epitaxial layer such that each said STI region extends at least a first depth below the upper surface of the semiconductor substrate,
wherein forming the gate dielectric structure comprises forming the shallow field oxide region such that it extends a second depth below the upper surface of the semiconductor substrate, wherein the first depth is greater than the second depth.

20. A method of fabricating a double-RESURF LDMOS transistor, the method comprising:
performing a first implant process during which an N-type dopant is implanted in a first region of a base semiconductor portion;
performing a second implant process during which a P-type dopant is implanted in a second region of the base semiconductor substrate, the second region overlapping the first region;
forming an epitaxial layer over the base portion, wherein a semiconductor substrate includes the base semiconductor portion and the epitaxial silicon layer, and an upper surface of the semiconductor substrate is formed by an exposed surface of the epitaxial layer;
annealing the semiconductor substrate such that the P-type dopant and the N-type dopant diffuse into the epitaxial layer to form a P-type buried layer and an N-type buried layer, wherein the P-type buried layer is disposed over the N-type buried layer;
forming a deep N-well region in a semiconductor substrate using a dopant having a first conductivity type, wherein the semiconductor substrate includes a base oxide layer disposed on an upper surface thereof and located over a first portion of the deep N-well region, and wherein the deep N-well region extends from the upper surface to the N-type buried layer;
forming a n-type drift implant region, a p-type surface field implant region and a gate dielectric structure through an opening defined in a mask such that the n-type drift implant region and the p-type surface field implant region are formed inside a second portion of the well region, and such that the gate dielectric structure is disposed on the upper surface, wherein both the n-type drift implant region and the p-type surface field implant region are self-aligned to the gate dielectric structure; and
forming a gate electrode on a portion of the base oxide layer and a portion of the gate dielectric structure.

\* \* \* \* \*